(12) United States Patent
Jones et al.

(10) Patent No.: US 11,788,189 B2
(45) Date of Patent: *Oct. 17, 2023

(54) DEPOSITING COATINGS ON AND WITHIN HOUSINGS, APPARATUS, OR TOOLS UTILIZING PRESSURIZED CELLS

(71) Applicant: Halliburton Energy Services, Inc., Houston, TX (US)

(72) Inventors: Christopher Michael Jones, Katy, TX (US); James M. Price, Cypress, TX (US); William Joseph Soltmann, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 321 days.

This patent is subject to a terminal disclaimer.

(21) Appl. No.: 17/004,724

(22) Filed: Aug. 27, 2020

(65) Prior Publication Data

US 2022/0064793 A1 Mar. 3, 2022

(51) Int. Cl.
*C23C 16/455* (2006.01)
*C23C 16/52* (2006.01)
*C23C 16/02* (2006.01)

(52) U.S. Cl.
CPC .... *C23C 16/45544* (2013.01); *C23C 16/0209* (2013.01); *C23C 16/52* (2013.01)

(58) Field of Classification Search
CPC .......... C23C 16/45544; C23C 16/0209; C23C 16/52
See application file for complete search history.

(56) References Cited

U.S. PATENT DOCUMENTS

| 5,154,862 A | 10/1992 | Reagan et al. |
| 6,416,577 B1 * | 7/2002 | Suntoloa ................. C23C 16/46 117/88 |

(Continued)

FOREIGN PATENT DOCUMENTS

| JP | H06279998 A | 10/1994 |
| JP | 2004337835 A | 12/2004 |

(Continued)

OTHER PUBLICATIONS

Foreign Communication from Related Application—International Search Report and Written Opinion of the International Searching Authority, International Application No. PCT/US2020/048794, dated May 27, 2021, 11 pages.

(Continued)

*Primary Examiner* — Kelly M Gambetta
(74) *Attorney, Agent, or Firm* — Conley Rose, P.C.; Rodney B. Carroll

(57) ABSTRACT

A coating system for coating, with a surface coating process, an interior surface of a housing defining an interior volume, having: a first closure and a second closure to sealingly engage with the housing; one or more first flow lines and second flow lines fluidically coupled to the first and second closure, respectively; a pressurized cell comprising a pressurized gas comprising at least one reactant and at a pressure of greater than a pressure within the housing, wherein the pressurized cell is fluidically coupled to a pressurized cell line comprising one of the first flow lines or second flow lines; and a controller in electronic communication with the pressurized cell and configured to control injection of a pulse of the pressurized gas into a flow of inert gas in the pressurized cell line, whereby the pulse is introduced into the interior volume, coating the interior surface with a coating layer.

19 Claims, 9 Drawing Sheets

(56) References Cited

U.S. PATENT DOCUMENTS

| | | | |
|---|---|---|---|
| 6,508,453 | B2 | 1/2003 | Mamyo |
| 6,863,130 | B2 | 3/2005 | Steele et al. |
| 7,300,684 | B2 | 11/2007 | Boardman et al. |
| 7,608,151 | B2 | 10/2009 | Tudhope et al. |
| 8,029,875 | B2 | 10/2011 | Wei et al. |
| 8,505,480 | B2 | 8/2013 | Biana |
| 8,753,725 | B2 | 6/2014 | Wei et al. |
| 9,238,864 | B2 | 1/2016 | Pelletier |
| 2003/0196600 | A1 | 10/2003 | Eidelman |
| 2006/0198965 | A1* | 9/2006 | Tudhope ........... C23C 16/45578 427/248.1 |
| 2012/0298901 | A1 | 11/2012 | Ringgenberg |
| 2014/0154417 | A1 | 6/2014 | Choi |
| 2014/0178637 | A1 | 6/2014 | Rajagopalan et al. |
| 2014/0260955 | A1 | 9/2014 | Aharonov |
| 2014/0287161 | A1 | 9/2014 | Ertas et al. |
| 2015/0059910 | A1 | 3/2015 | Honda et al. |
| 2015/0079309 | A1 | 3/2015 | Krueger et al. |
| 2016/0290103 | A1 | 10/2016 | Fontenelle et al. |
| 2018/0044800 | A1 | 2/2018 | Hendrix et al. |
| 2020/0017960 | A1 | 1/2020 | Tudhope et al. |

FOREIGN PATENT DOCUMENTS

| | | | |
|---|---|---|---|
| JP | 4437647 B2 | 2/2005 | |
| KR | 100346019 B1 | 8/2002 | |
| KR | 1020090114997 A | 11/2009 | |
| KR | 1020140076251 A | 6/2014 | |
| KR | 101446197 B1 | 10/2014 | |
| KR | 20160001133 U | 4/2016 | |
| WO | 2014042622 A1 | 3/2014 | |
| WO | 2017095361 A1 | 6/2017 | |
| WO | 2019040843 A1 | 2/2019 | |
| WO | WO-2019040843 A1 * | 2/2019 | ......... C23C 16/4401 |

OTHER PUBLICATIONS

Office Action (32 Pages), dated Dec. 8, 2021, U.S. Appl. No. 16/717,947, filed Dec. 17, 2021.

Office Action (32 Pages), dated Dec. 8, 2021, U.S. Appl. No. 16/717,939, filed Dec. 17, 2021.

Filing Receipt, Specification and Drawings for Provisional U.S. Appl. No. 62/819, 194, entitled "Depositing Coatings On and Within Tools," filed Mar. 15, 2019, 33 pages.

Filing Receipt, Specification and Drawings for U.S. Appl. No. 62/819,244, entitled "Depositing Coatings on and Within a Well Tool Usings a Well Tool Coating System Positioned Inside the Well Tool," filed Mar. 15, 2019, 31 pages.

Filing Receipt, Specification and Drawings for U.S. Appl. No. 16/717,947, entitled "Depositing Coatings On and Within Housings, Apparatus or Tools," filed Dec. 17, 2019, 87 pages.

Filing Receipt, Specification and Drawings for U.S. Appl. No. 16/717,939, entitled "Depositing Coatings on and Within a Well Tool Using a Well Tool Coating System Positioned Inside the Well Tool," filed Dec. 17, 2019, 105 pages.

Electronic Filing Receipt, Specification and Drawings for International Application No. PCT/US2019/067204, entitled " Depositing Coatings on and Within a Housing, Apparatus, or Tool Using a Coating System Positioned Therein," filed Dec. 18, 2019, 70 pages.

Electronic Filing Receipt, Specification and Drawings for International Application No. PCT/US2019/067203, entitled " Depositing Coatings on and Within Housings, Apparatus, or Tools," filed Dec. 18, 2019, 66 pages.

Foreign Communication from Related Application—International Search Report and Written Opinion of the International Searching Authority, International Application No. PCT/US2019/067203, dated Apr. 21, 2020, 11 pages.

Foreign Communication from Related Application—International Search Report and Written Opinion of the International Searching Authority, International Application No. PCT/US2019/067204, dated Apr. 21, 2020, 11 pages.

Foreign Communication from Related Application—International Search Report and Written Opinion of the International Searching Authority, International Application No. PCT/US2015/062910, dated Aug. 29, 2016, 13 pages.

Filing Receipt, Specification and Drawings for U.S. Appl. No. 17/004,707, entitled "Depositing Coatings On and Within Housings, Apparatus, or Tools Utilizing Counter Current Flow of Reactants," filed Aug. 28, 2020, 108 pages.

Electronic Filing Receipt, Specification and Drawings for International Application No. PCT/US2020/048794, entitled "Depositing Coatings On and Within Housings, Apparatus, or Tools Utilizing Counter Current Flow of Reactants," filed Aug. 31, 2020, 78 pages.

Electronic Filing Receipt, Specification and Drawings for International Application No. PCT/US2020/048791, entitled "Depositing Coatings On and Within Housings, Apparatus, or Tools Utilizing Pressurized Cells" filed Aug. 31, 2020, 78 pages.

Filing Receipt, Specification and Drawings for U.S. Appl. No. 16/670,886 entitled, "Focused Formation Sampling Method and Apparatus", filed Oct. 31, 2019, 76 pages.

Foreign Communication from Related Application—International Search Report and Written Opinion of the International Searching Authority, International Application No. PCT/US2020/048791, dated May 21, 2021, 11 pages.

* cited by examiner

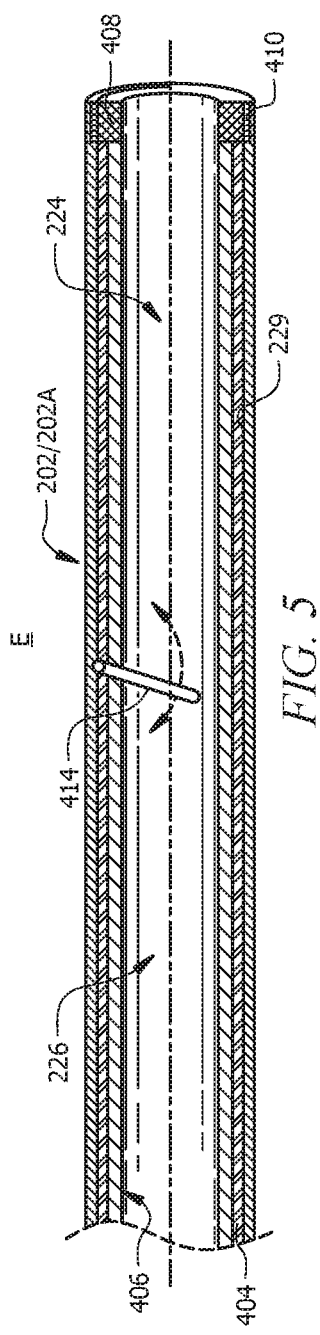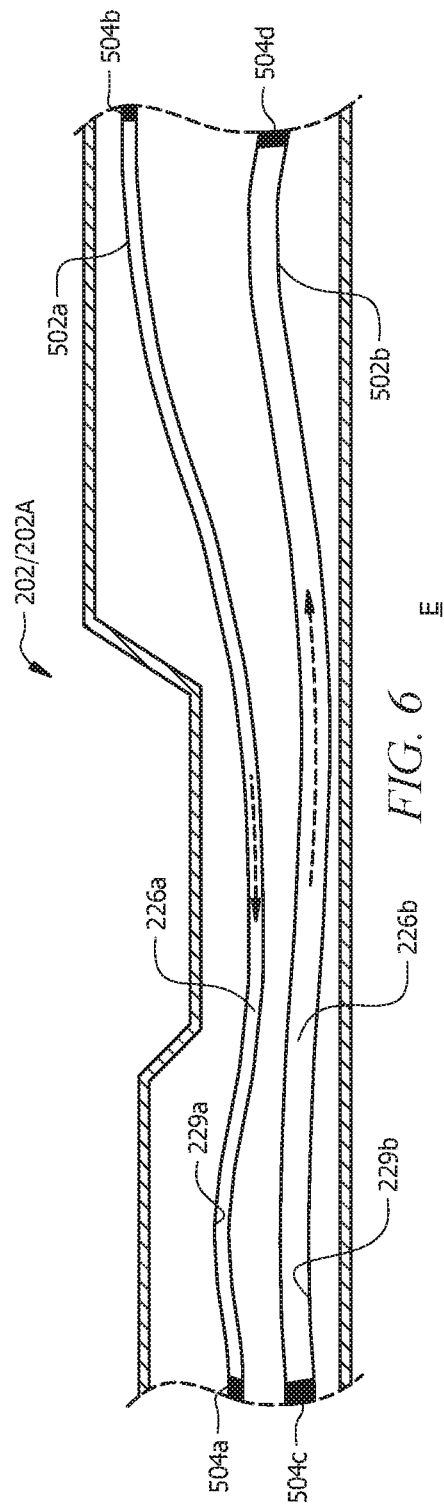

DEPOSITING COATINGS ON AND WITHIN HOUSINGS, APPARATUS, OR TOOLS UTILIZING PRESSURIZED CELLS

REFERENCE TO RELATED APPLICATIONS

N/A

TECHNICAL FIELD

The present disclosure relates generally to depositing coatings within housings, apparatus, or tools, such as well tools for use in a wellbore. More specifically, but not by way of limitation, this disclosure relates to depositing coatings on one or more interior surfaces of a housing, apparatus, or tool, for example, well tools.

BACKGROUND

In applications, it can be desirable to deposit a coating on an interior surface of a housing, apparatus, or tool (e.g., within a well tool) to withstand a particular environment to which the surface will be exposed during operation. For example, well tools for performing downhole operations are often subject to internal corrosion and abrasion as fluids flow through the well tools. Fluids such as hydrogen sulfide and mercury can also chemically react with (or be absorbed by) the interiors of the well tools. These destructive influences can reduce the lifespans of the well tools and cause a variety of other problems. A coating is sometimes deposited on a surface to withstand such environments and prolong tool life.

BRIEF SUMMARY OF THE DRAWINGS

For a more complete understanding of this disclosure, reference is now made to the following brief description, taken in connection with the accompanying drawings and detailed description, wherein like reference numerals represent like parts.

FIG. 5 is a cross-sectional side view of an example of a tool (e.g., a well tool) with coatings according to some aspects.

FIG. 6 is a partial view of another example of a tool (e.g., a well tool) having multiple deposition chambers according to some aspects.

DETAILED DESCRIPTION

Figure 1A:
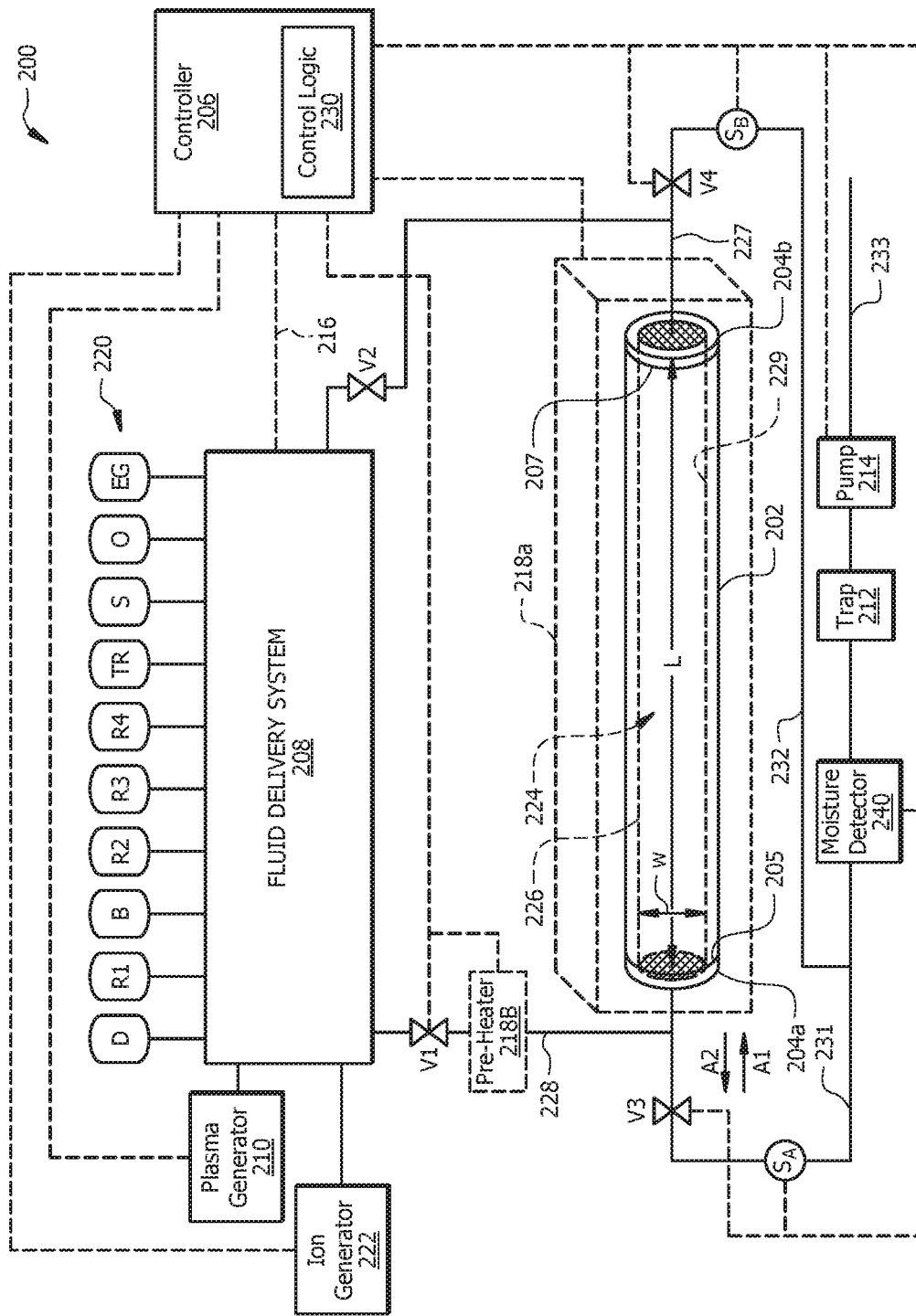
FIG. 1A is a schematic diagram of an example of a coating system according to some aspects.

It should be understood at the outset that although an illustrative implementation of one or more embodiments are provided below, the disclosed systems and/or methods may be implemented using any number of techniques, whether currently known or in existence. This disclosure, including the illustrative implementations, drawings, techniques and exemplary designs described herein, may be modified within the scope of the appended claims along with their full scope of equivalents.

Certain aspects and features of the present disclosure relate to a hybrid-type tool coating system (also referred to herein as a "coating system" or "coating device" or simply "device") and method for depositing coatings on site, on (or more specifically inside of or on an interior surface of, e.g., on a surface adjacent an interior volume of) a housing, apparatus, or tool (e.g., a well tool), optionally using one or both of a chemical vapor deposition (CVD) process and an atomic layer deposition (ALD) process. The coatings can resist physical wear on the interior surface of the housing, apparatus or tool (e.g., well tool) due to abrasive or corrosive elements flowing therethrough, enable the interior surface of the housing, apparatus or tool (e.g., well tool) to resist chemically reacting with or absorbing fluids, and otherwise serve as a protective barrier to resist destruction of the interior surface of the housing, apparatus or tool (e.g., well tool). The disclosed aspects of the coating system, as further detailed below, allow it to be made compact and portable for enabling it to be used at any suitable location, such as at a jobsite, worksite, or wellsite, in a laboratory environment, or elsewhere.

Any of a variety of housings, apparatus, or tools such as well tools (also referred to herein as wellbore tools or downhole tools) may have an interior surface on which to deposit a coating. Housings, apparatus, and tools such as well tools come in different shapes and sizes and also may have one or more passages connecting the interior region (also referred to herein as an "interior volume" or simply "volume") to other regions inside the housing, apparatus, or tool (e.g., well tool) and/or an external environment outside the housing, apparatus, or tool (e.g., well tool). In some examples of the present disclosure, an enclosed volume or enclosed interior volume may be formed within a selected housing, apparatus, or tool (e.g., well tool) using a closure, which may comprise one or more closure elements (e.g. plugs, gaskets, o-rings, non-circular sealing elements, threaded couplings, or any of a variety of other ways to block and preferably to sealingly close off a selected portion of one or more flow passages). The closure elements can have any suitable shape configured to block and conform as required to openings or passages leading into and out of the interior region of the housing, apparatus, or tool (e.g., well tool), to thereby enclose the internal volume of the housing, apparatus, or tool (e.g., well tool) having the internal surface(s) to be coated.

In some examples, the closure may be a single closure element that closes off a portion of an internal volume of the housing, apparatus, or tool (e.g., well tool), where the remainder of that internal volume is a sealed volume as defined by the housing, apparatus, or tool itself. In another example, an internal portion of the housing, apparatus, or tool (e.g., well tool) having the surface to be coated may be open at both ends, and the closure may comprise two closure elements that close off the internal volume at those ends. Any number (e.g. more than 2) of closure elements may be used to more specifically close off a portion of the housing, apparatus, or tool (e.g., well tool) to be internally coated, particularly in the event of complex internal shapes where some features are to be coated and other internal features are not to be coated (e.g. sensitive or non-metallic, non-wear features).

The closure elements may be structurally separate elements of a coating system that are releasably secured to the housing, apparatus, or tool (e.g., well tool), or the closure elements may be permanently attached to the housing, apparatus, or tool (e.g., well tool) and movable in and out of a closed position for closing selected internal locations of the housing, apparatus, or tool (e.g., well tool). For purpose of illustration, an example housing, apparatus, or tool (e.g., well tool) may have a cavity with a circular or other shaped cross-section, which may be closed off with a closure element at an upstream end and a closure element at a downstream end, thereby enclosing a volume (e.g., an "interior volume") within the cavity between the upstream and downstream closure elements.

In any given example, the enclosed volume may function as a de facto deposition chamber within the housing, apparatus, or tool (e.g., well tool) itself, into which one or more reactant gases and other gases useful in a coating process may be introduced, via a gas delivery system (i.e. gas supply system), as detailed hereinbelow.

At a high level, the gas supply system may comprise any of a variety of mechanical flow control elements that fluidly couple the one or more gas sources to the enclosed volume of the housing, apparatus, or tool (e.g., well tool), such as any combination of supply lines, manifolds, valves, pumps, and/or other flow control element(s). The gas supply system can be used to selectively couple selected ones of the plurality of reactant gas sources (or other process fluids) with the enclosed volume of the housing, apparatus, or tool (e.g., well tool). The one or more gas sources can include one or a plurality of reactant gas sources, one or more buffer gas sources, one or more topical reagent sources, one or more solvent sources, one or more oxidant sources, one or more etching gas sources, or a combination thereof, as detailed further hereinbelow. According to this disclosure one or more of the reactant gas sources comprise pressurized cells of the reactant gas.

In one example, a supply line with a valve coupled between a reactant gas source and the enclosed volume may be used to selectively open or close flow of that reactant gas source to the internal volume; and another supply line and/or valve may be used to selectively open or close flow of another reactant gas source to the internal volume, and the gas supply system may be operated such that only the selected gas(es) or other fluid(s) is/are supplied to the enclosed volume at any given time. One or more ports may be provided on the housing, apparatus, or tool (e.g., well tool) for selectively coupling the different gas sources to the enclosed volume. Although not required, these ports may be provided on the closure or closure elements themselves, such as a first closure element with a port for coupling one or more gas sources to a first end of the enclosed volume of the housing, apparatus, or tool (e.g., well tool) and a second closure element with a port for coupling the one or more gas sources to a second end of the enclosed volume of the housing, apparatus, or tool (e.g., well tool).

According to this disclosure, the controller is operably coupled to the gas supply system to control the flow of different gases (or other fluids) to the enclosed volume having the surface to be coated. The controller may be an electronic controller having control logic for controlling and optionally automating a sequence of gases, for processes like ALD and CLD that entail a very specific sequence of reactant gases such as those example processes detailed below. According to this disclosure, the controller is in electronic communication with the one or more (e.g., plurality of) reactant gas sources and the inert gas source, and is configured to control flow of inert gas from the inert gas source into the enclosed volume, and to control injection of reactant gas from the one or the plurality of reactant gas sources into the enclosed volume such that introduction of one or more pulses of the reactant gas into the enclosed volume are separated by introduction of the inert gas into the enclosed volume, whereby one or more coating layers are deposited on all or a portion of the interior surface within the enclosed volume. At least some of the pulses of reactant gas are provided by way of one or more pressurized cells. In aspects, one or more pulses of reactant gas are introduced into the enclosed volume co-currently (i.e., in the same direction) or counter currently (i.e., in opposite directions) from one or more pulses of the or another reactant gas.

In one application, once the deposition chamber (e.g., enclosed interior volume) is created as described above, a coating system can introduce reactant gases into the deposition chamber (e.g., via pathways through the closures) in order to perform one or more surface coating processes. For example, the coating system can include a fluid delivery system, e.g. a gas supply system, for selectively supplying the reactant gases to the deposition chamber inside the housing, apparatus, or tool (e.g., well tool). As used herein, reactant gases are gases that chemically react with a surface to produce a coating on the surface. Some examples of reactant gases include, by way of example and without limitation, silane, methane, and carbon monoxide. Other examples are provided below. The coating system can contain sufficient reactant gases to perform both a CVD process and an ALD process inside the housing, apparatus, or tool (e.g., well tool), making it a hybrid system capable of performing more than one type of surface coating process. The coating system of this disclosure includes the controller configured to control the fluid delivery system (e.g., in order to apply the CVD process, the ALD process, or both) to the deposition chamber inside the housing, apparatus, or tool (e.g., well tool).

Creating the deposition chamber inside the housing, apparatus, or tool (e.g., well tool) can enable the coating system to be used at any suitable location, without disassembling the housing, apparatus, or tool (e.g., well tool) into subcomponents and without the need for an expensive commercial vacuum-chamber as the deposition chamber. Rather, some examples of the present disclosure enable a surface coating process to be applied to a housing, apparatus, or tool (e.g., well tool) located at a jobsite or worksite (e.g., a wellsite), as many times as desired (e.g., after each job using the housing, apparatus, or tool). The coating system can also cost less than traditional deposition systems, since forming a deposition chamber inside a housing, apparatus, or tool (e.g., well tool) can be cheaper and/or faster than installing a commercial-grade vacuum chamber at a manufacturing or laboratory facility, which may be governed by tight regulations and cleanroom requirements.

The hybrid nature of aspects of the coating system can also promote surface coating in challenging conditions, unlike traditional deposition systems that only apply one type of surface coating process. For example, if an interior surface of a housing, apparatus, or tool (e.g., well tool) is poorly conditioned for ALD due to damage or other factors, a coating system of the present disclosure can first apply a base coating inside the housing, apparatus, or tool (e.g., well tool) using a CVD process to promote bonding during a subsequent ALD process. If an interior surface of a housing, apparatus, or tool (e.g., well tool) is poorly conditioned for CVD due to damage or other factors, the coating system can first apply a base coating inside the housing, apparatus, or tool (e.g., well tool) using an ALD process to promote bonding during a subsequent CVD process.

In aspects, disclosed herein is a coating system for coating, with one or more surface coating processes, an interior surface of a housing defining an interior volume comprises: a first closure and a second closure to sealingly engage with (e.g., a first end or inlet and a second end or inlet, respectively, of) the housing (e.g., to provide an enclosed volume); one or more first flow lines fluidically coupled to the first closure and one or more second flow lines fluidically coupled to the second closure; a pressurized cell comprising pressurized gas, wherein the pressurized gas comprises at least one reactant, wherein the pressurized gas is at a pressure of greater than a pressure within the housing (e.g., atmospheric pressure), wherein the pressurized cell is fluidically coupled to a pressurized cell line comprising one of the one or more first flow lines or one of the one or more second flow lines; and a controller in electronic communication with the pressurized cell, wherein the controller is configured to control injection of a pulse of the pressurized gas into a flow of inert gas in the pressurized cell line, whereby the pulse of the pressurized gas is introduced into the housing (e.g., into the interior/enclosed volume), coating the interior surface of the housing with a coating layer.

Further disclosed herein is a method of coating, with one or more surface coating processes, an interior surface of a housing defining an interior volume, the method comprising: positioning the coating system and a housing proximate each other, sealingly engaging the first closure to an inlet of the housing and sealingly engaging the second closure to an outlet of the housing (e.g., to form an enclosed volume); introducing one or more pulses of the pressurized gas from the one or each of the plurality of pressurized cells into the housing (e.g., into the interior or enclosed volume) via pulsing of the pressurized gas from the one or the each of the plurality of pressurized cells into an inert gas flow in the pressurized cell line; and depositing one or more coating layers on all or a portion of the interior surface within the housing by reaction of the one or more reactant gases.

In aspects, a method of coating an interior surface of a housing defining a volume comprises: enclosing all or a portion of the volume of the housing to yield an enclosed volume; introducing one or more reactant gases to the enclosed volume via an inlet line; and forming one or more coating layers on all or a portion of an interior surface of the housing via atomic layer deposition (ALD) or chemical vapor deposition (CVD) of the one or more reactant gases, wherein at least one of the one or more reactant gases is introduced into the enclosed volume by introducing a pulse of pressurized gas comprising the at least one of the one or more reactant gases into a flow of inert gas in the inlet line or directly into the enclosed volume.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure. The herein disclosed coating system can be utilized to deposit one or more coatings on an interior surface of a housing, apparatus, or tool (also referred to both individually and collectively herein by any individual term "tool", "housing", or "apparatus"), for example as will be described further herein with reference to FIG. 1A. Accordingly, the description herein is thus applicable to generic coating systems for coating generic apparatus, housings, or tools. Likewise, the description herein is applicable to, without limitation, specific uses such as, without limitation, "well tool coating systems" and "well tools", for example as will be described further herein with reference to FIG. 1B. By way of example, the term "housing" includes, but is not limited to, a structural component having an interior volume such as (without limitation) one or more components of an apparatus, device, or tool such as a well tool. While certain description herein is made with reference to well tools and well tool coating systems, in should be understood that the concepts disclosed herein are not limited to any specific embodiment such as well tools and well tool coating systems, but rather may be applied generally to coating systems configured to effectively coat an interior surface adjacent an interior volume disposed within a housing, or apparatus, via any of the various techniques (e.g., ALD and/or CVD deposition techniques) disclosed herein, or via another deposition process adapted to employ pressurized cell(s) of reactant gas(es), as described herein.

Figure 1B:
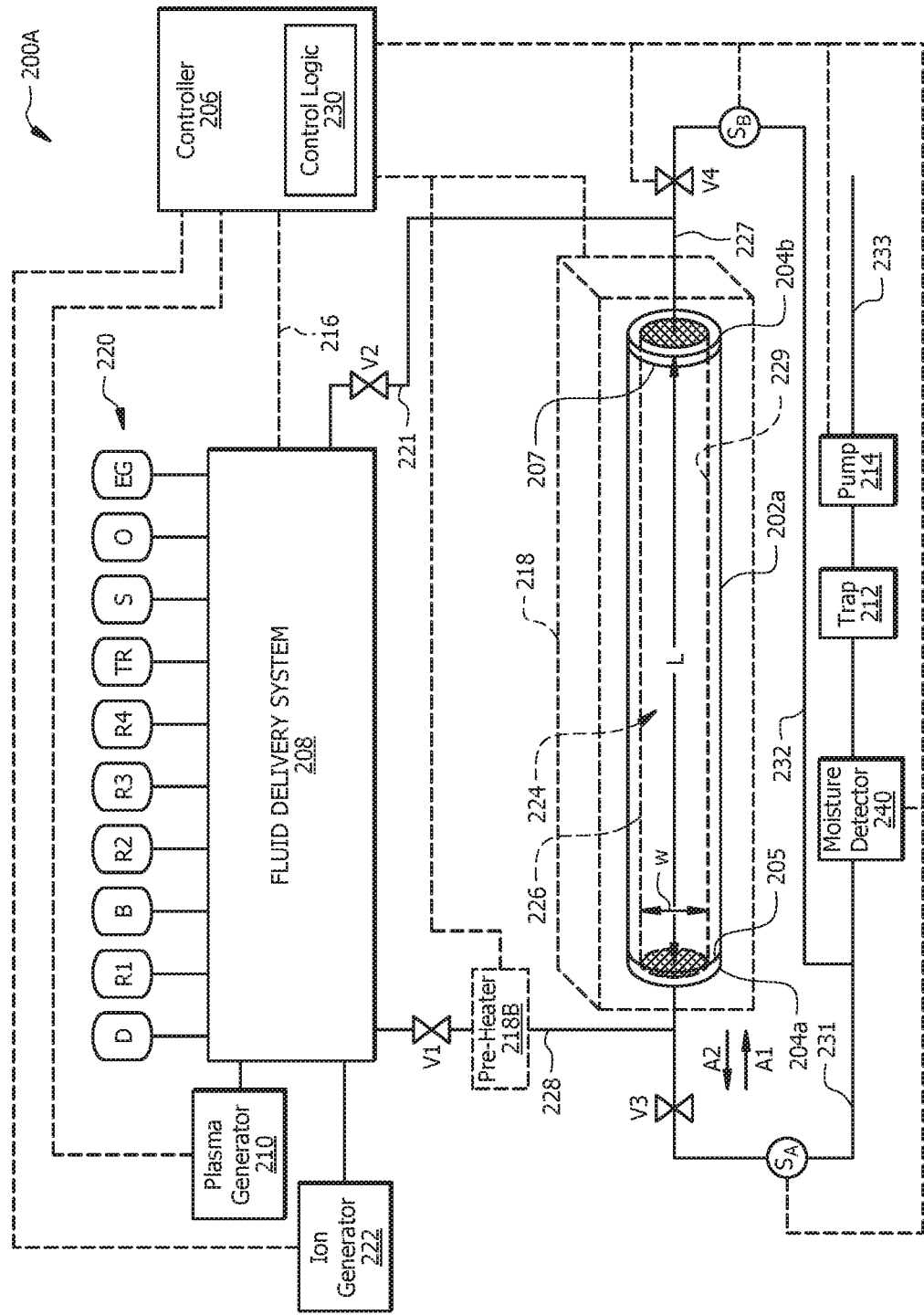
FIG. 1B is a schematic diagram of an example of a well tool coating system according to some aspects.

FIG. 1A is a schematic diagram of an example of a coating system 200 that can apply one or more coatings on or inside a generic housing, apparatus or tool 202, also referred to herein as a housing 202, an apparatus 202, or a tool 202. As noted hereinabove, a coating system of this disclosure can be utilized to deposit one or more coatings on or within a variety of housings, apparatus, or tools. One such embodiment is depicted in FIG. 1B, which is a schematic diagram of an example of a coating system 200A (also referred to herein as a "well tool coating system 200A") being utilized to apply one or more coatings on or inside a well tool 202A. Well tool 202A is usable for performing one or more downhole operations, such as, without limitation, drilling, logging, fracturing, fishing, pulling, casing, cementing, or any combination of these or other downhole operation.

Figure 2:
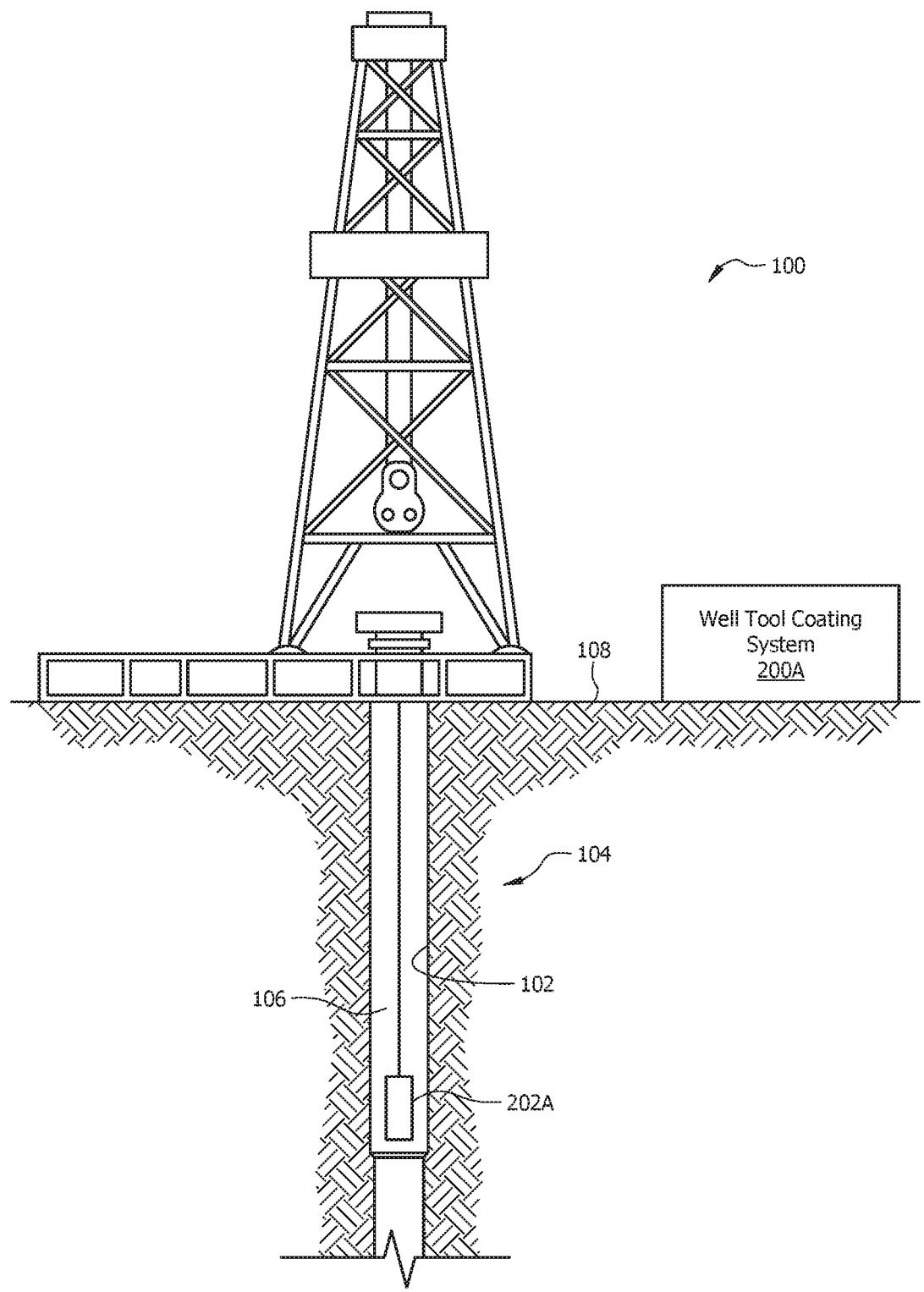
FIG. 2 is a generalized cross-sectional side view of an example of a well system with a well tool coating system according to some aspects.

FIG. 2 is a generalized cross-sectional side view of an example of a wellsite 100 at which a wellbore 102 is drilled through various earth strata of a subterranean formation 104 bearing hydrocarbons. The wellbore 102 is at least partially drilled and completed in this example, including a casing string 106 cemented within the wellbore 102 that extends from the well surface 108 through at least a portion of the drilled subterranean formation 104. The casing string 106 can provide a conduit through which produced formation fluids (e.g., production fluids) can travel from downhole to the well surface 108. Without being limited to the particular features of the illustrated well, it should be recognized that well tools suitable for coating according to this disclosure may be involved throughout the process of initially drilling, forming, and completing the wellbore 102, and throughout the service life of the wellbore 102 and beyond. The wellsite 100 of FIG. 2 is illustrated by way of example as an onshore well system, although the disclosure is equally applicable to wells formed offshore.

A coating system 200 according to this disclosure can be positioned at a jobsite (also referred to herein as a work site) for applying coatings on interior surfaces 229 of a housing, apparatus, or tool 202/well tool 202A at the jobsite. The coating system or device 200 can apply the coating(s) to the housing, apparatus, or tool 202/well tool 202A at any suitable time, such as before the tool performs an operation, after the tool performs an operation, or both. As will be described further hereinbelow, the coating system 200 can be capable of applying the coating(s) to the housing, apparatus, or tool 202/well tool 202A using multiple types of surface coating processes, such as ALD and/or CVD For example and with reference to FIG. 1B, a well tool coating system 200A according to this disclosure can be positioned at the wellsite 100 (FIG. 2) for applying coatings on interior surfaces 229 of a well tool 202A at the wellsite 100. The well tool coating system 200A can apply the coatings to the well tool 202A at any suitable time, such as before the well tool 202A performs a downhole operation, after the well tool 202A performs a downhole operation, or both. The well tool coating system 200A is capable of applying the coatings to the well tool 202A using multiple types of surface coating processes, such as ALD and CVD.

Figure 3:
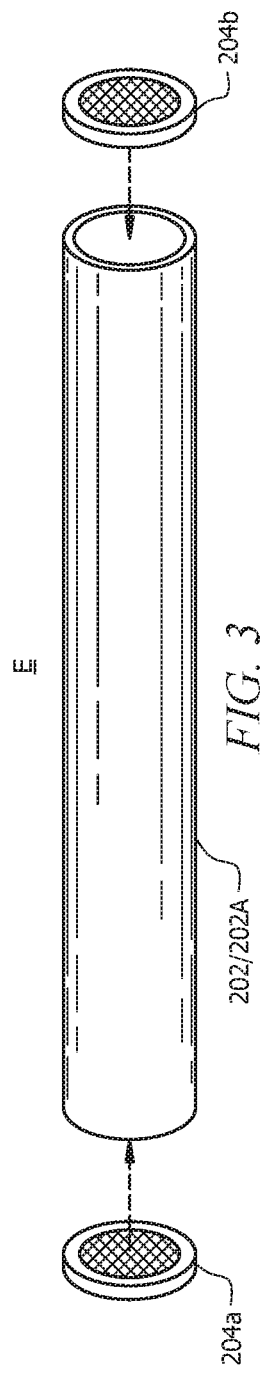
FIG. 3 is a perspective view of an example of a tool (e.g., a well tool) and closures according to some aspects.

More specifically, in FIG. 1A/FIG. 1B, the tool 202/well tool 202A has an interior region or interior volume 224 that can be enclosed (e.g., at the ends or two different locations thereof that are not necessarily ends of the tool 202/well tool 202A) by closures (including first closure 204a on first end (or location) 205 and second closure 204b on second end (or location) 207) in order to form an enclosed volume 226 (e.g., a deposition chamber) inside the tool 202/well tool 202A. The enclosed volume 226 is bound on the sides (e.g., along length L thereof) by the inner perimeter (e.g., inner circumference or interior surface 229) of the tool 202/well tool 202A and at the ends by the closures (e.g., first closure 204a and second closure 204b). FIG. 3 is a perspective view of an example of a housing, apparatus, or tool 202 (e.g., a well tool 202A) and first closure 204a and second closure 204b, according to some aspects. The closures (e.g., first closure 204a and second closure 204b) can include closure elements, such as valves, gaskets, end caps, or any other sealing device of suitable shape and size to seal (e.g., substantially seal) the interior region or volume 224 of the tool 202/well tool 202A from the external environment outside the tool 202/well tool 202A and/or for introduction of reactant gas thereto. In some examples, the closures (e.g., first closure 204a and second closure 204b) are existing parts (e.g., disks, stoppers, plugs, caps, valves or gates) of the tool 202/well tool 202A repurposed for creating the enclosed volume 226 therein. Alternatively, the closures (e.g., first closure 204a and second closure 204b) can be distinct from the tool 202/well tool 202A, for example as shown in FIG. 3, and selectively secured to the tool 202/well tool 202A by a user (automatically or manually) to create the enclosed volume 226.

While the first and second closures 204a/204b are circular in FIG. 1A, FIG. 1B, and FIG. 3, it will be appreciated by those of skill in the art and with the help of this disclosure that the closures (e.g., first closure/second closures 204a/204b) can have other shapes (e.g., square, triangular, oval, or octagonal shapes) in other examples in order to cooperate with tools 202/well tools 202A of other shapes. Likewise, although the tool 202/well tool 202A is depicted in FIG. 1A, FIG. 1B, and FIG. 3 to FIG. 7 as tubular, tools 202/well tools 202A come in a wide variety of shapes and configurations, and such tools have interior regions/volumes 224 for which it may be desirable to apply a coating. Consequently, the shape, location, and other characteristics of the enclosed volume 226 inside the tool 202/well tool 202A can vary widely depending on the type and configuration of the tool 202/well tool 202A. For example, and without limitation, the enclosed volume 226 can be relatively "long and skinny" or "long and narrow" which may be difficult to coat via traditional coating techniques. For example, and without limitation, the enclosed volume 226 can have an aspect ratio that is less than or equal to about 0.5, 0.05, or 0.005, wherein the aspect ratio is an average width W (e.g., diameter for cylindrical tools 202/well tools 202A) of the interior volume 224 divided by an average length L thereof. The process of creating the enclosed volume 226 (e.g., how the enclosed volume 226 is closed off from the external environment and other regions of the tool 202/well tool 202A) can also vary widely, depending on the geometry of the tool 202/well tool 202A and the configuration of passages, openings, etc., leading into and out of the tool 202/well tool 202A.

Referring back to FIG. 1A/FIG. 1B, after the enclosed volume 226 (e.g., deposition chamber(s)) is created inside the tool 202/well tool 202A, the coating system 200/well tool coating system 200A can apply one or more coatings of material to interior surfaces 229 inside the tool 202/well tool 202A using a fluid delivery system 208 and controller 206. The fluid delivery system 208 is coupled to sources 220 (e.g., tanks or containers) of gases (and optionally of other fluids) and the enclosed volume 226 by conduit(s) or "flow line(s)", such as first flow lines 228 and second flow lines 227 (e.g., pipes, tubing, etc.). The fluid delivery system 208 can selectively couple the sources 220 of gases and/or other fluids (including reactant gas sources) with the enclosed volume 226 to implement a surface coating process. Depicted in FIG. 1A and FIG. 1B are reactant gas sources including first reactant gas source R1, second reactant gas source R2, third reactant gas source R3, and fourth reactant gas source R4, buffer or inert gas source B, oxidant gas source O, solvent source S, topical reagent source TR, etching gas source EG, and drying gas source D. According to this disclosure, at least one of the reactant gas sources, such as first reactant gas source R1, second reactant gas source R2, third reactant gas source R3, or fourth reactant gas source R4 is a pressurized cell, as described further hereinbelow.

The fluid delivery system 208 can include any suitable components, such as valves, manifolds, headers, and/or conduits, for controlling fluid communication there-through. In some aspects, the fluid delivery system 208 can deliver the gases and/or other fluid through a valve or port in a first closure 204a (e.g., one or more first closures 204a) that allows the gases to enter the enclosed volume 226 in a first direction as indicated by arrow A1 or through a valve or port in a second closure 204b (e.g., one or more second closures 204b) that allows the gases to enter the enclosed volume 226 in a second direction counter current to the first direction as indicated by arrow A2, while still otherwise closing off the enclosed volume 226 from the external environment. In alternative aspects, fluid delivery system 208 can deliver the gases and/or other fluid to housing, apparatus, or tool 202 in direction A1 or A2 only (i.e., co-currently in the direction indicated by arrow A1 or co-currently in the direction indicated by arrow A2), and pulses of reactant gas are introduced in the same direction (i.e., co-currently). Alternatively or additionally, the fluid delivery system 208 can supply one or more gases and/or other fluids to the enclosed volume 226 through other access valve(s), port(s) or the like in the body of the tool 202/well tool 202A. With reference to FIG. 1A and FIG. 1B, a coating device or system 200/well tool coating device or system 200A according to this disclosure for coating a surface 229 of an interior region or volume 224 disposed within a housing or tool 202, wherein the interior volume 224 has a first end (or location) 205 and second end (or location) 207 and extends through the housing, apparatus, or tool 202/well tool 202A such that the interior volume 224 is accessible from an exterior E of the housing, apparatus, or tool 202/well tool 202A via the first end (or location) 205 and the second end (or location) 207, can comprise: a first closure 204a and a second closure 204b to sealingly engage with a first end 205 and a second end 207, respectively, of the housing, apparatus, or tool 202 to provide an enclosed volume 226; one or more first flow lines 228 fluidically coupled to the first closure 204a and one or more second flow lines 227 fluidically coupled to the second closure 204b; a pressurized cell (e.g., at least one of first reactant gas source R1, second reactant gas source R2, third reactant gas source R3, or fourth reactant gas source R4) comprising pressurized gas; and a controller 206 in electronic communication (as depicted via dotted lines in FIG. 1A and FIG. 1B) with the pressurized cell, wherein the controller 206 is configured to control injection of a pulse of the pressurized gas into a flow of inert gas in a pressurized cell line, whereby the pulse of the pressurized gas is introduced into the enclosed volume 226, coating the interior surface 229 of the housing, apparatus, or tool 202 with a coating layer. The pressurized cell line comprises one of the one or more first flow lines 228 or one of the one or more second flow lines 227 via which the pressurized cell is fluidically coupled to the enclosed volume 226. The pressurized gas in the pressurized cell comprises at least one reactant gas, and has a pressure of greater than atmospheric pressure.

In aspects, controller 206 is configured to control flow of inert gas from the inert gas source B into the enclosed volume 226, and control counter current injection of the reactant gas from the one or the plurality of reactant gas sources 220 into the enclosed volume 226 (e.g., injection of one or more pulses of reactant gas into enclosed volume 226 via first closure 204a in the direction indicated by arrow A1 alternated with counter current injection of one or more pulses of the or another reactant gas into enclosed volume 226 via second closure 204b in the direction indicated by arrow A2) such that introduction of one or more pulses of the reactant gas into the enclosed volume 226 are separated by introduction of the inert gas B into the enclosed volume 226 Alternatively or additionally, controller 206 can be configured to control flow of inert gas from the inert gas source B into the enclosed volume 226, and control concurrent injection of pulses of the reactant gas(es) from the one or the plurality of reactant gas sources 220 into the enclosed volume 226 (e.g., injection of one or more pulses of reactant gas into enclosed volume 226 via first closure 204a or second closure 204b in the direction indicated by arrow A1 or arrow A2, respectively, alternated with concurrent injection of one or more pulses of the or another reactant gas into enclosed volume 226 via first closure 204a or second closure 204b, respectively, such that introduction of one or more pulses of the reactant gas into the enclosed volume 226 are again separated by introduction of the inert gas B into the enclosed volume 226.

The coating system can further include a plasma generator 210 configured to generate a plasma and fluidically coupled to the (or another) flow line, such as first flow line 228 or second flow line 227; and one or more pumps, such as a pump 214 fluidically coupled to a second flow line 227, a first flow line 228, or both and configured to create a vacuum in the interior volume 226, said vacuum effective to draw one or more reactant gases from the plurality of reactant gas sources 220 and optionally plasma from the plasma generator 210 into the interior volume 224 of the housing 202/well tool 202A via the first flow line 228 or the second flow line 227 and first end 205 or second end 207, respectively, such that, upon reaction of the one or more reactant gases, optionally in the presence of the plasma, a coating is formed on all or a portion of the surface 229 of the interior volume 224 of the housing, apparatus, or tool 202/well tool 202A. As described further hereinbelow, the coating device or system 200/well tool coating device or system 200A can further comprise an ion generator 222, configured for applying an atomic layer etching (ALE) process to the surface 229; a heating unit 218a in thermal communication with the housing, apparatus, or tool 202/well tool 202A and in electronic communication with a controller 206 to control heating of the housing, apparatus, or tool 202/well tool 202A; a preheater on a flow line, such as preheater 218b on first flow line 228 of FIG. 1A, in electronic communication with a controller 206 to control heating of fluid (e.g., drying gas) introduced into the housing, apparatus, or tool 202/well tool 202A; and/or a trap 212 upstream of the pump 214 and downstream of the housing or tool 202/well tool 202A, wherein the trap 212 is operable as a filter and/or a second auxiliary coating chamber. For example, trap 212 can be used as a filter prior to the pump 214. Alternatively or additionally, a trap 212 (e.g., from which 'filter element(s)' thereof have been removed) can be utilized as an auxiliary coating chamber. This auxiliary chamber can be utilized to coat additional 'pieces' of the housing, apparatus, or tool 202/well tool 202A, for example, when these pieces are individual elements small enough to fit into the trap 212 (e.g., tool windows, valves, plugs, etc.). In such instances, the pieces can be inserted within the trap 212 for coating according to the methods described herein. Trap 212 can be fluidically connected via a flow line 231 and a flow line 232 with a first end 205 and a second end 207 of (e.g., a last) housing, apparatus, or tool 202/well tool 202A (in a series thereof). Line 233 can be fluidically coupled with pump 214 for removal of unreacted reactants and inert gas passing therethrough.

As detailed further hereinbelow, the one or more surface coating processes can comprise, without limitation, chemical vapor deposition (CVD), atomic layer deposition (ALD), or both. The coating device or system 200/well tool coating device or system 200A can be portable. In such embodiments, the coating device or system 200/well tool coating device or system 200A can further comprises a portable conveyance or hauler (e.g., trailer, skid, vehicle, etc.) configured to transport the coating device 200/well tool coating device or system 200A to a worksite (e.g., wellsite 100 of FIG. 2).

Controller 206 comprises control logic 230 designed to control flow of the inert gas from the inert gas source(s) B into the enclosed volume 226, and to control introduction of one or more pulses of the pressurized gas from the pressurized cell(s) into the enclosed volume 226 via pulsing of the pressurized gas from the pressurized cell(s) into an inert gas flow in the pressurized cell line (e.g., a first flow line 228 or second flow line 227 fluidly connected with the pressurized cell(s)). In aspects, controller is further operable to control counter current injection of the reactant gas from the one or the plurality of reactant gas sources 220 into the enclosed volume 226 such that introduction of one or more pulses of the reactant gas into the enclosed volume 226 are separated by introduction of the inert gas into the enclosed volume 226, as described, for example, in U.S. patent application Ser. No. 17/004,707 entitled "Depositing Coatings on and Within Housings, Apparatus, or Tools Utilizing Counter Current Flow of Reactants" filed Aug. 27, 2020, the disclosure of which is hereby incorporated herein in its entirety for purposes not contrary to this disclosure. For example, control logic 230 of controller 206 can control introduction of a continuous flow of buffer gas from inert or buffer gas source B into enclosed volume 226 via first flow line 228 or second flow line 228, and countercurrent introduction of pulses of reactant gas from the reactant gas source(s) 220, one or more of which is a pressurized cell as described herein.

Coating, with one or more surface coating processes, the interior surface 229 of the housing, apparatus, or tool 202 defining the interior volume 224 according to this disclosure comprises: positioning the coating system 200 and the housing, apparatus, or tool 202 proximate each other, sealingly engaging the first closure 204a to a first end 205 of the housing, apparatus, or tool 202 and sealingly engaging the second closure 204b to a second end 207 of the housing, apparatus, or tool 202 to form the enclosed volume 226; introducing one or more pulses of the pressurized gas from the one or each of the plurality of pressurized cells (e.g., at least one of reactant gas sources 220, such as first reactant gas source R1, second reactant gas source R2, third reactant gas source R3, or fourth reactant gas source R4) into the enclosed volume 226 via pulsing of the pressurized gas from the one or the each of the plurality of pressurized cells 220 into an inert gas flow in the pressurized cell line; and depositing one or more coating layers on all or a portion of the interior surface within the enclosed volume by reaction of the one or more reactant gases.

One or more of the reactant gas sources 220 (e.g., first reactant gas source R1, second reactant gas source R2, third reactant gas source R3, fourth reactant gas source R4, and optionally a topical reagent source TR, an oxidant source O, a solvent source S, and/or an etching gas source EG, described further hereinbelow) comprise pressurized cells comprising the gas at a pressure of greater than atmospheric pressure. For example, the one or the plurality of first reactant gas sources R1 can comprise one or a plurality of first pressurized cells comprising a first pressurized gas, wherein the first pressurized gas comprises the one or more first reactant gases and has a pressure of greater than atmospheric pressure, and the one or the plurality of second reactant gas sources R2 can comprise one or a plurality of second pressurized cells comprising a second pressurized gas, wherein the second pressurized gas comprises the one or more second reactant gases at a pressure of greater than atmospheric pressure, and so on. The one or each of the plurality of first pressurized cells can be fluidically coupled to the housing, apparatus, or tool 202 via a first pressurized cell line comprising one of the one or more first flow lines 228 or second flow lines 227, and the one or each of the plurality of second pressurized cells can be fluidically coupled to a second pressurized cell line comprising one of the one or more first flow lines 228 or second flow lines 227, such that one or more pulses of the first pressurized gas can be introduced into the housing, apparatus, or tool 202 co-currently or counter currently from introduction thereto of one or more pulses of the second pressurized gas. For example, in such aspects, the controller 206 can be in electronic communication with the one or the plurality of first pressurized cells R1 and the one or the plurality of second pressurized cells R2, and configured to control injection of one or more pulses of the first pressurized gas from the first pressurized cell into a flow of inert gas in the first pressurized cell line (e.g., a first flow line 228 or second flow line 227) and one or more pulses of the second pressurized gas from the second pressurized cell into a flow of inert gas in the second pressurized cell line (e.g., a second flow line 227 or first flow line 228), such that the one or more pulses of the first pressurized gas and the one or more pulses of the second pressurized gas are separately introduced into the enclosed volume 226 with inert gas being introduced into the enclosed volume 226 prior to and subsequent introduction thereto of each of the one or more pulses of the first pressurized gas and the one or more pulses of the second pressurized gas.

In aspects, the coating system 200 comprises a plurality of first pressurized cells, a plurality of second pressurized cells, etc., or both a plurality of first pressurized cells and a plurality of second pressurized cells and etc. For example, in aspects, one or more (e.g., all) of the first reactant gas source(s) R1, second reactant gas source(s) R2, third reactant gas source(s) R3, and fourth reactant gas source(s) R4 are pressurized cells.

Figure 4A:
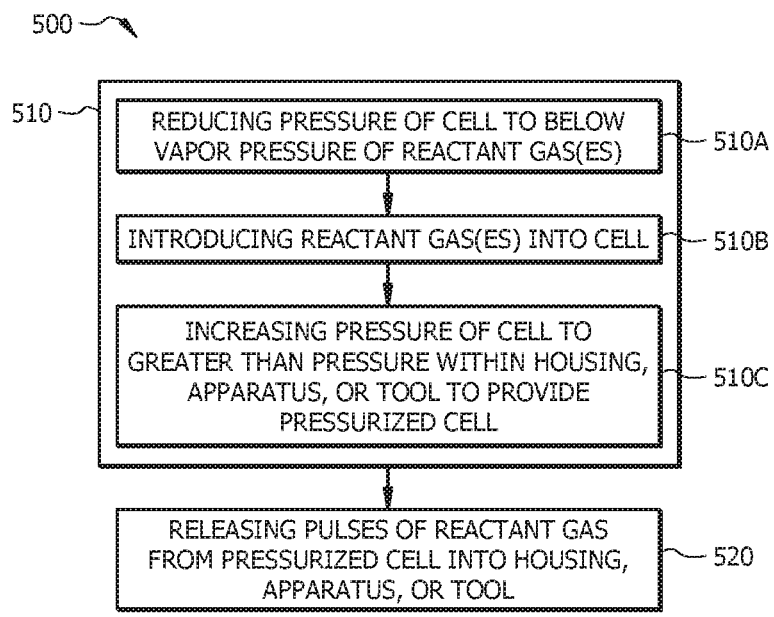
FIG. 4A is a flow diagram of a method of forming and using a pressurized cell according to some aspects.
Figure 4B:
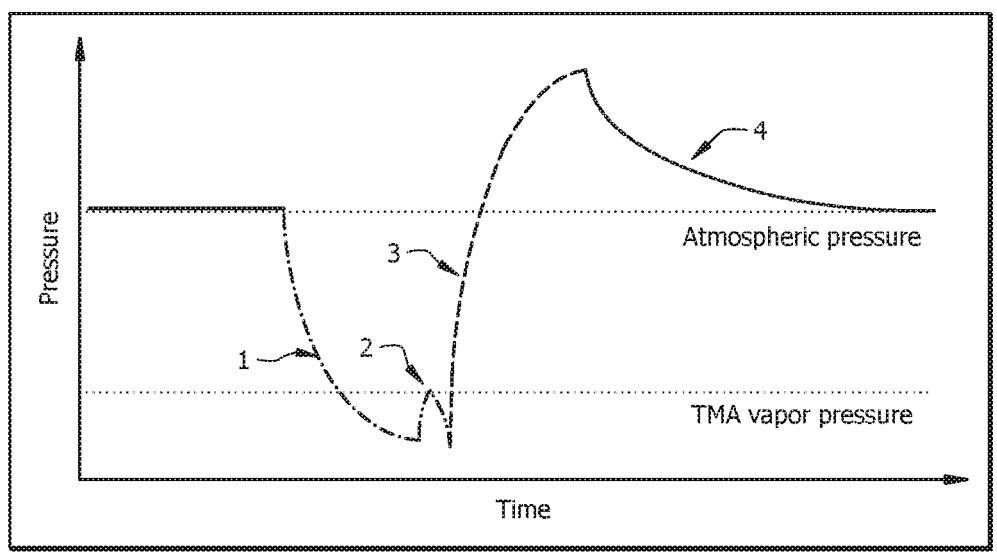
FIG. 4B is a graph of pressure within a cell as a function of time during formation and use of a pressurized cell according to some aspects.

As depicted in FIG. 4A, a method of forming and using a pressurized cell according to this disclosure 500 can include forming the pressurized cells at 510 and releasing one or more pulses of reactant gas from the pressurized cell into the housing, apparatus, or tool 202 at 520. The coating method of this disclosure can thus further comprise forming one or more of the pressurized cells 510. As depicted in FIG. 4A, forming the pressurized cell can include reducing a pressure of a cell to less than a vapor pressure of the reactant gas to be pressurized therein at 510A, introducing the reactant gas into the cell at 510B, and increasing the pressure of the cell to the pressure of greater than the pressure within the housing, apparatus, or tool 202/well tool 202A (e.g., greater than the pressure within the interior/enclosed volume), at 510C. Increasing the pressure of the cell to the pressure of greater than the pressure within the housing, apparatus, or tool 202/well tool 202A (e.g., the interior/enclosed volume pressure), can include introducing of additional gas into the cell. The additional gas can comprise the reactant gas and/or an inert buffer gas. For example, the coating method can comprise forming one or each of a plurality of first pressurized cells and/or one or each of a plurality of second pressurized cells, etc., by reducing a pressure of a cell to less than a vapor pressure of the one or more first reactant gases and/or the one or more second reactant gases, respectively, introducing the one or more first reactant gases and/or the one or more second reactant gases, etc., respectively, into the cell, and increasing the pressure of the cell to the pressure of greater than the pressure within the housing, apparatus, or tool 202/well tool 202A (e.g., the interior/enclosed volume pressure), via introduction of additional gas into the cell. The additional gas can comprise at least one of the one or more first reactant gases and/or at least one of the one or more second reactant gases, etc., respectively, or an inert buffer gas. FIG. 4B is a graph of pressure within the cell as a function of time during formation of a pressurized cell at 510 and use thereof at 520. In FIG. 4B, 1 depicts the pressure profile during step 510A of reducing a pressure of a cell to less than a vapor pressure of the reactant gas to be pressurized therein, 2 depicts the pressure profile during the step 510B of introducing the reactant gas into the cell, 3 depicts the pressure profile during the step 510C of increasing the pressure of the cell to the pressure of greater than the pressure within the housing, apparatus, or tool 202/well tool 202A (e.g., the interior/enclosed volume pressure), via introduction of additional gas into the cell, and 4 depicts the reducing pressure profile as pulses of the reactant gas in the pressurized cell are injected from the pressurized cell (e.g., the reactant gas source when it comprises a pressurized cell) into the pressurized cell line (e.g., one of the first flow line(s) 228 or second flow line(s) 227) during use of the pressurized cell at 520.

The pressurized gas in the pressurized cell can consist of or comprise the reactant gas. For example, the first pressurized gas can consist of the one or more first reactant gases, or the first pressurized gas can further comprise from about 10 to about 90 volume percent (vol %), from about 20 to about 80 vol %, or from about 30 to about 70 vol % of a buffer gas; and/or the second pressurized gas can consist of the one or more second reactant gases, or the second pressurized gas can further comprise from about 10 to about 90 volume percent (vol %), from about 20 to about 80 vol %, or from about 30 to about 70 vol % of a buffer gas, and the like for reactant gas source(s) R3 and R4. The buffer gas in the pressurized cell(s) can be the same inert gas flowing (e.g., from buffer gas source B) in the flow line (e.g., first flow line 228 or second flow line 227) via which the pressurized gas is introduced into the housing or tool 202, or can be a different gas. In aspects, the pressurized gas comprises from about 10 to about 5000 mg/cm$^3$, from about 30 to about 3500 mg/cm$^3$, or from about 150 to about 1000 mg/cm$^3$. The pressurized cell can have any suitable volume, such as, for example and without limitation, from about 10 to about 100 cm$^3$, from about 10 to about 50 cm$^3$, or from about 20 to about 100 cm$^3$.

In aspects, the coating system comprises the plurality of reactant gas sources 220, one or more first flow lines 228, and one or more second flow lines 227, wherein the plurality of reactant gas sources 220 include one or a plurality of first reactant gas sources R1 comprising one or more first reactant gases and one or a plurality of second reactant gas sources R2 comprising one or more second reactant gases. The one or each of the plurality of the first reactant gas sources R1 can be fluidically coupled to one of the one or more first flow lines 228 and the one or each of the plurality of the second reactant gas sources R2 can be fluidically coupled to one of the one or more second flow lines 227, such that controller 206 can provide counter current injection of one or more pulses of the first reactant gas and one or more pulses of the second reactant gas. Alternatively or additionally, one or each of the plurality of the first reactant gas sources R1 can be fluidically coupled to one of the one or more first flow lines 228 or second flow lines 227 and the one or each of the plurality of the second reactant gas sources R2 can also be fluidically coupled to one of the one or more first flow lines 228 or second flow lines 227, such that controller 206 can provide concurrent injection of one or more pulses of the first reactant gas and one or more pulses of the second reactant gas into enclosed volume 226.

The controller 206 can be configured to alternate introduction, into the housing, apparatus, or tool 202, of one or more pulses of the first pressurized gas with one or more pulses of the second pressurized gas. The one or more first reactant gases and the one or more second reactant gases can be the same or different. For example, the coating system 200 of this disclosure can be utilized to provide concurrent and/or countercurrent injection of pulses of a reactant gas. That is, controller 206 can control alternating injection of one or more pulses of a reactant gas into housing or tool 202 via first end 205 by introduction of the one or more pulses of the reactant gas from a reactant gas source 220 into a flowing stream of inert gas in first flow line 228 with one or more pulses of the same or a different reactant gas from the same or another reactant gas source 220 into housing, apparatus, or tool 202 via first end 205 or second end 207 by introduction of the one or more pulses of the same or the different reactant gas from a reactant gas source 220 into a flowing stream of inert gas in a first flow line 228 or a second flow line 227. In aspects, the one or more first reactant gases and the one or more second reactant gases are the same, whereby one or more pulses of the same one or more reactant gases are alternately introduced into the enclosed volume 226 co-currently via the first end 205 or the second end 207 of the housing or tool 202 or counter currently via the first end 205 and the second end 207 of the housing or tool 202. Alternatively, the one or more first reactant gases and the one or more second reactant gases are different, whereby one or more pulses of the one or more first reactant gases can be alternately introduced into the enclosed volume 226 via the first end 205 or the second end 207 of the housing, apparatus, or tool 202 co-currently or counter currently with one or more pulses of the one or more second reactant gases introduced into the enclosed volume 226.

The pulses can comprise a desired amount of reactant per pulse. For example and without limitation, each of the pulses can comprise from about 1 to about 10 mg, from about 2 to about 9, or from about 3 to about 7 mg of reactant.

The coating system 200 can further comprise: a heater, such as preheater 218B; and a drying gas source D. The heater is in thermal communication with the drying gas source D, the housing, apparatus, or tool 202, and/or a line (e.g., a first flow line 228, as depicted in FIG. 1A, or second flow line 227) fluidically coupling the drying gas source D and the housing, apparatus, or tool 202 such that a hot drying gas can be provided within the enclosed volume 226 to dry the interior surface 229 of the housing, apparatus, or tool 202 prior to introduction of reactant gas (e.g., any of the one or more first reactant gases or the one or more second reactant gases, etc.) thereto. For example, preheater 218B of FIG. 1A and FIG. 1B is depicted on first flow line 228, and can be utilized during drying of the interior surface 229 of the housing, apparatus, or tool 202 prior to introducing gas (e.g., any of the one or more first, second, third, or fourth reactant gases from first, second, third, or fourth reactant gas sources R1, R2, R3, or R4, respectively, the etching gas from etching gas source EG, the oxidant from oxidant gas source O, the solvent from solvent source S, and/or buffer from buffer source B) into the housing, apparatus, or tool 202. In such aspects, controller 206 can be in further electronic communication with the heater 218B and/or the drying gas source D (e.g., via fluid delivery system 208) to control the heater 218B, and/or the drying gas source D during the one or more surface coating processes.

As noted hereinabove, the coating system 200 can further comprise one or more pumps upstream or downstream of the housing, apparatus, or tool 202. In some such aspects, the one or more pumps include a vacuum pump on at least one of the one or more first flow lines 228, a vacuum pump on at least one of the one or more second flow lines 227, or both a vacuum pump on at least one of the one or more first flow lines 228 and a vacuum pump on at least one of the one or more second flow lines 227, wherein the vacuum pump is configured to create a vacuum in the enclosed volume 226 during drying, whereby the one or more first flow lines 228 or the one or more second flow lines 227 having the vacuum pump can operate as a vacuum line. In such a manner, drying with the drying gas from drying gas source D can be effected via heating under vacuum.

A moisture detector 240 can be positioned on the vacuum line to measure a moisture content (e.g., dryness) of hot drying gas removed from the enclosed volume 226 during the drying. The method can comprise drying by providing a hot drying gas in the enclosed volume 226, and monitoring the drying by measuring a moisture content of the hot drying gas passing out of the housing, apparatus, or tool 202 during the drying. The method can comprise drying to a desired moisture content, such as a moisture content of less than or equal to about 0.01, 0.005, or 0.001 volume percent (vol %) moisture. In aspects the moisture content of the hot drying gas removed from the enclosed volume 226 during drying falls to a value of less than or equal to about 0.001, 0.01, 0.1, or 1 volume percent moisture prior to introduction of any reactant gas into the housing or tool 202. The drying gas can be the same inert gas flowing in the flow line into which the reactant gas is introduced from the reactant gas source 220, or a different gas. Desirably, the drying gas utilized for the drying has a purity (e.g., a non-water content or "dryness") of greater than or equal to about 99.999, 99.99, 99.9, or 99 volume percent.

The coating system 200 can further comprise a sensor for monitoring a thickness of the one or more coating layers. For example such a sensor $S_A$ can be positioned on a first flow line 228 and/or a sensor $S_B$ can be positioned on a second flow line 227. Each such sensor (e.g., sensor $S_A$, sensor $S_B$) can comprise a sensor for measuring a concentration of unreacted reactants passing out of the enclosed volume 226, a quartz crystal microbalance, or an optical monitor. In such aspects, the controller 206 can be in electronic communication with the sensor $S_A/S_B$ and operable to adjust a duration of introduction of the reactant gas (e.g., the one or more first reactant gases and/or the one or more second reactant gases, etc.), an order of introduction of the reactant gas (e.g., the one or more first reactant gases and/or the one or more second reactant gases, etc.), a concentration of the reactant gas (e.g., the one or more first reactant gases and/or of the one or more second reactant gases, etc.) introduced into the enclosed volume 226, or a combination thereof. In such aspects, the method can further comprise: monitoring a thickness of the one or more coating layers being deposited during the depositing, by measuring a concentration of unreacted reactant(s) (e.g., a concentration of one or more first reactant gases and/or a concentration of unreacted one or more second reactant gases, etc.) passing out of the enclosed volume 226; measuring, via a quartz crystal microbalance, a mass being deposited during the depositing; or measuring, via an optical monitor, the thickness of the one or more coating layers being deposited; and controlling a duration of the introducing of the reactant gas(es) (e.g., the introducing of the one or more first reactant gases and/or the introducing of the one or more second reactant gases, etc.) into the enclosed volume 226, an order of introducing of the reactant gas(es) (e.g., the one or more first reactant gases and/or the one or more second reactant gases, etc.) into the enclosed volume 226, a concentration of the reactant gas(es) (e.g., the one or more first reactant gases and/or of the one or more second reactant gases, etc.) being introduced into the enclosed volume 226, or a combination thereof to optimize the depositing of the one or more coating layers.

One example of a surface coating process that the coating system 200/well tool coating system 200A can apply to an interior surface 229 of the tool 202/well tool 202A is ALD. ALD can involve four main steps that are repeated to deposit a coating of a desired thickness on a surface: (i) a first step involving introducing a first reactant gas from a first reactant gas source R1 into an enclosed volume 226 containing a surface (e.g., interior surface 229 which may or may not already have a coating layer thereupon) such that at least some of the reactant gas chemically bonds with the surface (e.g., interior surface 229 which may or may not already have a coating layer thereupon) to form a reactive layer, (ii) a second step involving removing leftovers of the first reactant gas or gaseous byproducts produced during the first step from the enclosed volume 226, (iii) a third step involving introducing a second reactant gas into the enclosed volume 226 such that at least some of this second reactant gas bonds with the reactive layer from the first step to form a monolayer, and (iv) a fourth step involving removing leftovers of the second reactant gas or gaseous byproducts produced during the third step from the enclosed volume 226. Some or all of these steps can be repeated as many times as is required to obtain the desired number of coating layers and the desired thickness of each layer. According to this disclosure, a first reactant gas source R1 or a second reactant gas source R2 that provides pulses of the first reactant gas and/or the second reactant gas is a pressurized cell, as described previously. According to this disclosure, pulses of the first reactant gas and/or the second reactant gas can be introduced into the housing or tool 202 via concurrent or counter current pulsing. Steps (ii) and (iv) are effected via introduction of the pulses in a flowing stream of the inert gas.

To implement an ALD process, the coating system 200/well tool coating system 200A includes at least a first reactant gas, a second reactant gas, and a buffer gas (e.g., an inert gas such as nitrogen gas). These are provided in FIGS. 1A/1B as reactant gas source R1, reactant gas source R2, and buffer gas source B. In aspects, first reactant gas source R1 and second reactant gas source R2 are pressurized cells. First reactant gas and buffer gas can be used in the first step of the ALD process. The buffer gas (also referred herein to as inert gas) can be used alone in the second step of the ALD process (e.g., to purge the enclosed volume 226 of reactant gas). The second reactant gas and the buffer gas can be used in the third step of the ALD process. The buffer gas can again be used alone in the fourth step of the ALD process. While this example involves using the same buffer gas throughout the steps, other examples can involve using different buffer gases for various steps. Still other examples may exclude the buffer gas altogether in some of the steps (e.g., steps two and four) and/or use a pump 214 for performing these steps. For example, the well tool coating system 200 can include pump 214 (e.g., a vacuum pump) coupled to the enclosed volume 226 for suctioning reactant gases, gaseous byproducts, and/or buffer gases out of the enclosed volume 226 (e.g., in order to implement the second and fourth steps of the ALD process). Also referred to as a "buffer gas", the buffer gas in buffer gas source B can be used as a 'carrier' gas for first reactant gas and second reactant gas in steps (1) and (3), respectively, and as a buffer for steps (2) and (4). The same or different buffer gas(es), e.g. nitrogen ($N_2$), can be utilized in steps (1) and/or (3) as in steps (2) and/or (4). In aspects, the use of pressurized cells as gas sources can allow operation of the coating system at atmospheric pressure, in which case pump 214 may be absent.

The coating system 200/well tool coating system 200A can include any suitable combination of reactant gases and buffer gases for performing the ALD process. For example, the first reactant gases in first reactant gas source R1 and the second reactant gas in second reactant gas source R2 can include trimethyl-aluminum and ozone or water, respectively, for producing coating layers of aluminum oxide inside the tool 202/well tool 202A. Alternatively, the first and second reactant gases in first reactant gas source R1 and second reactant gas source R2, respectively, can form coatings of titanium dioxide, hafnium dioxide, zirconium dioxide, tantalum pentoxide, or other group IVB metal oxides and their silicate alloys, inside the tool 202/well tool 202A.

In some examples, the inert or buffer gas from buffer gas source B can include nitrogen, helium, neon, xenon, argon, or any other inert gas that does not chemically react with the reactant gases and the surface 229 to be coated.

Still referring to FIGS. 1A/1B, another example of a surface coating process that the coating system 200/well tool coating system 200A can apply to an interior surface 229 of the tool 202/well tool 202A is CVD. CVD can generally involve introducing at least one reactant gas into the enclosed volume 226 such that it chemically reacts with a surface (e.g., interior surface 229 which may or may not already have a coating layer thereupon) inside the enclosed volume 226. In some examples, CVD can involve introducing two or more reactant gases simultaneously and continuously into the enclosed volume 226 such that they chemically react with a surface (e.g., interior surface 229 which may or may not already have a coating layer thereupon) inside the enclosed volume 226.

To implement the CVD process, the coating system 200/well tool coating system 200A can include at least a third reactant gas, which is represented in FIG. 1A/1B as from third reactant gas source R3. The coating system 200/well tool coating system 200A may also include a fourth (or more) reactant gas for implementing the CVD process. The fourth reactant gas is represented in FIG. 1A/1B as fourth reactant gas source R4. The third and fourth reactant gases in third and fourth reactant gas sources R3/R4 can each include any suitable reactant gas for performing a CVD process. For example, the third reactant gas or the fourth reactant gas can be configured to form coatings of carbide, silicon carbide, or aluminum oxide inside the tool 202/well tool 202A. The third/fourth reactant gases are stored in third and fourth reactant gas sources R3/R4, from which they can be supplied (e.g., via one or more first flow lines 228 and/or second flow lines 227) to the enclosed volume 226 inside the tool 202/well tool 202A.

According to this disclosure, the third reactant gas source R3, the fourth reactant gas source R4, or both can be pressurized cells as described hereinabove. In aspects, the third reactant gas and/or the fourth reactant gas can be introduced into the housing or tool 202 via concurrent and/or counter current pulsing.

As noted hereinabove, to control the surface coating processes, the coating system 200/well tool coating system 200A includes controller 206, that can be coupled to the fluid delivery system 208 by control lines 216 (shown in dotted lines in FIG. 1A and FIG. 1B). The controller 206 is a physical device that can operate (e.g., the fluid delivery system 208) to control fluid flow into the enclosed volume 226 within the tool 202/well tool 202A. The controller 206 can be a mechanical controller, a hydraulic controller, an electrical controller, or any combination of these. In an example in which the controller 206 is a mechanical controller, the control lines 216 can be links or cables and the fluid delivery system 208 can include mechanically controlled pumps, valves, etc. In an example in which the controller 206 is a hydraulic controller, the control lines 216 can be hydraulic lines and the fluid delivery system 208 can include hydraulically controlled pumps, valves, etc. In an example in which the controller 206 is an electrical controller, the control lines 216 can be wires and the fluid delivery system 208 can include electrically controlled pumps, valves, etc. For example, with reference to FIG. 1A and FIG. 1B, controller 206 can be in electronic communication with fluid delivery system 208 and valves, such as valve V1 on first flow line 228, valve V2 on second flow line 227, valve V3 on a line fluidically connecting first end 205 of housing 202 with trap 212, and valve V4 on a line fluidically connecting second end 207 of housing 202 with trap 212 to control the flow of fluids throughout coating system 200. Additional or fewer valves can be utilized, as will be apparent to those of skill in the art.

Controller 206 includes a processing device communicatively coupled to a memory device for executing control logic 230 stored on the memory device. Non-limiting examples of the processing device include a Field-Programmable Gate Array (FPGA), an application-specific integrated circuit (ASIC), a microprocessor, etc. The memory device can be non-volatile and may include any type of memory device that retains stored information when powered off. Non-limiting examples of the memory device include electrically erasable and programmable read-only memory (EEPROM), flash memory, or any other type of non-volatile memory. In some examples, at least some of the memory device can includes a non-transitory computer-readable medium, such as a magnetic disk, memory chip, read only memory (ROM), random-access memory (RAM), an ASIC, optical storage, or any other medium from which a computer processor can read the control logic 230, which can include program code for automating a sequence of steps, including reactant gas introduction from one or more pressurized cell(s), for performing an ALD process, a CVD process, and/or any another surface coating process or processes.

The controller 206 can actuate the fluid delivery system 208 via the control lines 216 to implement the ALD process, the CVD process, and/or another surface coating process. For example, the controller 206 can sequentially actuate valves inside the fluid delivery system 208 such that first/second reactant gases from first/second reactant gas sources R1/R2 flow to the enclosed volume 226 in order to perform an ALD process. The controller 206 can also simultaneously actuate valves inside the fluid delivery system 208 such that third/fourth reactant gases from third/fourth reactant gas sources R3/R4 flow to the enclosed volume 226 in order to perform a CVD process. The controller 206 may further control a pump 214 (e.g., a vacuum pump), which can suction gases (e.g., reactant gases, buffer gases, byproduct gases) out of the tool 202/well tool 202A and optionally through a trap 212 that serves as a filter. Alternatively, the pump 214 can be separately controlled independently of the controller 206. Controller 206 can also control drying via electronic communication thereof with preheater 218B, heater 218A, moisture detector 240, and drying gas source D.

The coating system 200/well tool coating system 200A can include other components as well. For example, the coating system 200/well tool coating system 200A can include a plasma generator 210 coupled to the controller 206, which can operate the plasma generator 210 to assist in performing a surface coating process. The plasma generator 210 can convert reactant and/or inert or otherwise non-reactive gases into plasmas for performing a surface coating process. This may enable surface coating to occur under a wider range of ambient conditions (e.g., temperatures and pressures) inside the enclosed volume 226 as compared to a thermal approach. The presence of plasma may also enable a wider range of material properties to be realized as compared to a thermal approach employing other sources of heat (e.g., via heating unit 218). In some examples, the plasma generator 210 includes a glass or quartz tube that serves as a plasma chamber and electrodes positioned within the plasma chamber. A direct current (DC) voltage can then be applied to the electrodes that causes reactant gases (e.g., hydrogen, oxygen, ammonia, or silane) flowing therethrough to be converted into plasmas, which are then introduced into the enclosed volume 226. The properties of the plasmas can be tuned by adjusting the spacing between the electrodes, the applied voltage, and the pressure inside the plasma chamber. In some examples, the plasma generator 210 can generate microwave plasmas, electron cyclotron resonance plasmas, or radio-frequency driven inductively coupled plasmas.

As noted above, the coating system 200/well tool coating system 200A can include a heating unit 218 coupled to the controller 206, which can operate the heating unit 218 as part of performing a surface coating process. One example of the heating unit 218 can be an oven or heating jacket, which can receive the tool 202/well tool 202A and apply thermal energy to the tool 202/well tool 202A in order to assist in performing a surface coating process.

The coating system 200/well tool coating system 200A may further include a solvent, an oxidizer, or both. These are represented in FIG. 1A/1B as solvent source S and oxidizer source O. The solvent is a substance that can dissolve another substance. Examples of solvents include toluene, xylene, benzene, carbon tetrachloride, tetrahydrofuran, dichloromethane, and d-limonene. The oxidizer is a substance that can oxidize another substance (e.g., cause the other substance to lose electrons). Examples of oxidizers include sulfur and nitrous oxide. The coating system 200/well tool coating system 200A can operate the fluid delivery system 208 to flush the enclosed volume 226 inside the housing, apparatus, or tool 202/well tool 202A with solvent S, the oxidizer O, or both. The coating system 200/well tool coating system 200A may flush the enclosed volume 226 with one or both of these prior to performing a surface coating process in the enclosed volume 226. This can prepare the enclosed volume 226 for the surface coating process and help promote bonding.

In some examples, the coating system 200/well tool coating system 200A further includes one or more topical reagents. These are represented in FIG. 1A/1B as topical reagent source TR. A topical reagent is a substance configured to chemically react with a coating layer deposited inside the enclosed volume 226 in order to change a material characteristic of the coating layer. Examples of material characteristics can include wettability, stiffness, strength, ductility, hardness, density, electrical conductivity, thermal conductivity, and corrosion resistance. The coating system 200/well tool coating system 200A can operate the fluid delivery system 208 to apply the topical reagent from topical reagent source TR to one or more coating layers inside the tool 202/well tool 202A, thereby adjusting one or more material characteristics of the coating layer(s). As a particular example, the coating system 200/well tool coating system 200A can apply a topical reagent that includes hydrochloric acid to a coating layer inside the tool 202/well tool 202A. If the coating layer is formed from hydrogen, the hydrochloric acid can burn off at least some of the hydrogen to improve the wettability of the coating layer.

The coating system 200/well tool coating system 200A can also include one or more etching gases such as from etching gas source EG and an ion generator 222 for applying an atomic layer etching (ALE) process inside the tool 202/well tool 202A. ALE can be viewed as the reverse of the layer deposition process of ALD, in the sense that ALE uses sequential and self-limiting reactions to remove thin layers of material from a surface. The coating system 200/well tool coating system 200A can operate the fluid delivery system 208 to apply the ALE process, for example, in order to pre-treat the enclosed volume 226 prior to a surface coating process or to reduce the thickness of a coating layer resulting from a surface coating process.

ALE generally involves four main steps that are repeated: (i) a first step involving applying an etching gas from etching gas source EG to a surface in an enclosed volume 226 such that the surface chemically reacts with and adsorbs the etching gas, and (ii) a second step involving purging the etching gas and any gaseous byproducts resulting from the first step from the enclosed volume 226, (iii) a third step involving applying low-energy ions to the portions of the surface that chemically reacted with the etching gas in order to etch away (e.g., remove) those portions, and (iv) a fourth step involving purging byproducts resulting from the third step. The controller 206 can implement the first step by actuating the fluid delivery system 208 to supply the etching gas from an etching gas source EG to within the enclosed volume 226. Examples of the etching gas can include argon, fluorine, chlorine, boron trichloride, and hydrogen bromide. The controller 206 can implement the second and fourth steps by actuating the pump 214, actuating the fluid delivery system 208 to supply a buffer gas (e.g., buffer gas from buffer gas source B) to within the enclosed volume 226, or both of these. Alternatively, the etching gas can be introduced as one or more pulses from etching gas source EG into a flowing stream of buffer gas, in a similar manner to that described hereinabove for introduction of the reactant gas(es) into the housing, apparatus, or tool 202. The controller 206 can implement the third step by actuating an ion generator 222, which can supply the low-energy ions to the enclosed volume 226. Some or all of these steps can be repeated as many times as is required.

While the coating system 200/well tool coating system 200A shown in FIG. 1A/1B includes a certain amount and arrangement of components for illustrative purposes, other examples can include more, fewer, or a different arrangement of these components. For example, the coating system 200/well tool coating system 200A can include more or fewer control lines, conduits (e.g., first flow lines 228, second flow lines 227), reactant gases, buffer gases, topical reagents, solvents, oxides, etching gases, valves, or any combination of these. In one such example, the coating system 200/well tool coating system 200A only includes one, two, or three reactant gases (e.g., from a first reactant gas source R1, a second reactant gas source R2, and/or a third reactant gas source R3). At least one of the reactant gases (e.g., second reactant gas) can be common to at least two surface coating processes. Also, some examples may exclude the plasma generator 210, the trap 212, the pump 214, the heating unit 218, the preheater 218B, the sensor $S_A$, the sensor $S_B$, the moisture detector 240, the ion generator 222, or any combination of these. Further, while some examples above are described in relation to ALD and/or CVD, other examples can involve other types and combinations of surface coating processes.

One example of the tool 202/well tool 202A after applying various coatings is shown in FIG. 5, which depicts a partial view of the tool 202/well tool 202A comprising a cylindrical housing having an interior surface 229. In FIG. 5, the tool 202/well tool 202A includes an enclosed volume 226 with coatings deposited using different types of surface coating processes. In one example, the coatings include a base layer 404 deposited onto interior surface 229 during a CVD process to improve bonding with another coating layer 406 deposited onto layer 404 during an ALD process. In another example, the coatings include a base layer 404 deposited onto interior surface 229 during an ALD process to improve bonding with another coating layer 406 deposited onto layer 404 during a CVD process. Other examples can involve any number and combination of coatings deposited (e.g., sequentially deposited to build up a plurality of layers providing a desired coating thickness) using any number and combination of surface coating processes. The base layer 404 can be deposited directly onto an uncoated interior surface 229, optionally after cleaning and/or etching (e.g., ALE) thereof.

Still with reference to FIG. 5, a cover 408 can be positioned inside the enclosed volume 226 to prevent a surface coating process from being applied to a part 410 (e.g., a length or section) of the interior surface 229 of tool 202/well tool 202A. In some examples, the cover 408 can include a metal plate or ring disposed over one or more grooves, collets, threads, or ridges inside the tool 202/well tool 202A to prevent one or more surface coating processes from being applied thereto. For example, the cover 408 can be positioned to protect one or more threads at one or more ends of the tool 202/well tool 202A from being damaged.

In some examples, the interior region or volume 224 of the tool 202/well tool 202A can include a movable part 414. Examples of the movable part 414 can include a flap, valve, port, latch, pump, motor, tubular, ball, sleeve, piston, spring, seat, or any other component configured to rotate, pivot, translate, or otherwise move inside the enclosed volume 226. The movable part 414 can be actuated during a surface coating process, for example, to ensure that one or more coatings are adequately applied to the movable part 414. For example, a controller (e.g., controller 206 of FIG. 2) can actuate the movable part 414 between at least two positions during an ALD process, a CVD process, or both. In one example in which the movable part 414 is a valve or port, the at least two positions can include an open position and a closed position. In one example in which the movable part 414 is a latch, the at least two positions can include a latched position and an unlatched position. In one example in which the movable part 414 is a flap, the at least two positions can include various pivot angles. Any number and combination of movable parts can be actuated between any number and combination of positions within the enclosed volume 226. By actuating the movable part during or between coatings, an entire surface of the movable part 410 that will come into contact with a fluid that can potentially be corrosive or otherwise interfere with the tool 202/well tool 202A (e.g., interfere with a measurement obtained with the tool 202/wellbore tool 202A) can be coated during the coating process. The movable part can be a sample probe (40, as described further hereinbelow with reference to FIG. 7), that can be coated in both an extended and a retracted configuration relative to a well tool 202A.

FIG. 6 is a partial view of another example of a tool 202/well tool 202A having multiple passages (e.g., first passage 502a and second passage 502b) therethrough. In one example, the passages (e.g., first passage 502a and second passage 502b) are for providing different types of fluid to tool 202/well tool 202A (e.g., downhole to a well tool 202A) and from tool 202/well tool 202A (e.g., from a well tool 202A to the well surface 108 (FIG. 2)). The passages (e.g., first passage 502a and second passage 502b) can be enclosed by closures 504a-d (e.g., including first closure 504a, second closure 504b, third closure 504c, and fourth closure 504d), thereby forming multiple enclosed volumes inside the passages (e.g., first enclosed volume 226a and second enclosed volume 226b). One or more surface coating processes can then be applied by the coating system 200/well tool coating system 200A to the passages (e.g., first passage 502a and/or second passage 502b) to coat them with layers of material. In the embodiment of FIG. 6, first closure 504a and second closure 504b seal off passage 502a to provide first enclosed volume (or first deposition chamber) 226a and third closure 504c and fourth closure 504d seal off passage 502b to provide second enclosed volume (or second deposition chamber) 226b. The interior surface 229a of first enclosed volume 226a and the interior surface 229b of second enclosed volume 226b can be coated simultaneously and/or sequentially utilizing the same or different coating processes (e.g., ALD and/or CVD), depending on the fluids to which the interior surfaces are expected to be exposed during operation of the tool 202/well tool 202A during operation.

As noted hereinabove, a housing, apparatus, or tool 202/well tool 202A coated via the coating system 200 of this disclosure can comprise any apparatus, housing, or tool 202 for which a coating on an interior surface 229 thereof is desired. For example, and without limitation, the housing, apparatus, or tool 202 can comprise a furnace tube, an aircraft component (e.g., a wing, a fuselage), a component of a water supply/treatment system; a component of a vehicle fuel system; a well tool 202A; a heat exchanger or component thereof such as a shell or plurality of tubes; a pump or component thereof such as a suction or discharge chamber; a reactor or component thereof such as a vessel, manifold, catalyst bed, injector, feed and/or discharge conduit; a distillation column or component thereof such as valves or trays; a condenser or component thereof such as a housing or condenser tubes; a reboiler or component thereof such as a housing or heating tubes; an interior volume of a storage vessel; an interior volume of a transportation vessel (e.g., a fluid transport trailer pulled by a semi truck); or another housing, apparatus, or tool 202/well tool 202A.

In some embodiments, housing, apparatus, or tool 202 comprises a well tool 202A, and the coating system 200 is referred to herein as a well tool coating system 200A. For example and without limitation, the well tool 202A can comprise a logging tool or a wireline tool. For example and without limitation, the well tool 202A can be a drilling tool, such as, without limitation, a logging while drilling (LWD) tool, a measurements while drilling (MWD) tool, or a sampling while drilling (SWD) tool. In some such embodiments, the interior volume or region 224 of the well tool 202A comprises a fluid flow path (or "flow passage") configured for flow of a formation fluid from an exterior E of the well tool 202A through an interior (e.g., interior volume 224) of the well tool 202A.

The coating system can comprise or be configured for operation with a plurality of housings 202 connected in series and/or in parallel, wherein each of the plurality of housings 202 comprises a first closure 204a and a second closure 204b to sealingly engage with a first end 205 and a second end 207, respectively, of the housing 202 to provide an enclosed volume 226, and one or more first flow lines 228 fluidically coupled to the first closure 204a and one or more second flow lines 227 fluidically coupled to the second closure 204b; wherein the second flow lines 227 fluidically coupled to each of the plurality of housings 202 are fluidically coupled as the first flow lines 228 to any immediately downstream housing 202. In aspects, a plurality of n housings 202 are connected in series. The plurality can comprise (i.e., n can be) from about 2 to about 30, from about 2 to about 15, or from about 5 to about 10 housings 202. Each housing $202_x$ of the plurality of housings 202 except a last housing $202_n$ of the series of housings 202 (i.e., all housings $202_x$, where x is 1 to n−1, from a first housing $202_1$ to a penultimate housing $202_{n-1}$) is fluidically coupled with an immediately downstream housing $202_{x+1}$ via a U-shaped connector. One or more of the U shaped connectors can be fluidically coupled with a reactant gas source R (e.g., one of the plurality of first reactant gas sources R1 and/or one of the plurality of second reactant gas sources R2, etc.), whereby the reactant gas(es) (e.g., the one or more first reactant gases and/or the one or more second reactant gases, etc.) can be injected into the one or more U-shaped connectors and thereby introduced into the enclosed volume 226 of a housing 202 immediately downstream of the one or more U-shaped connectors.

Figure 7:
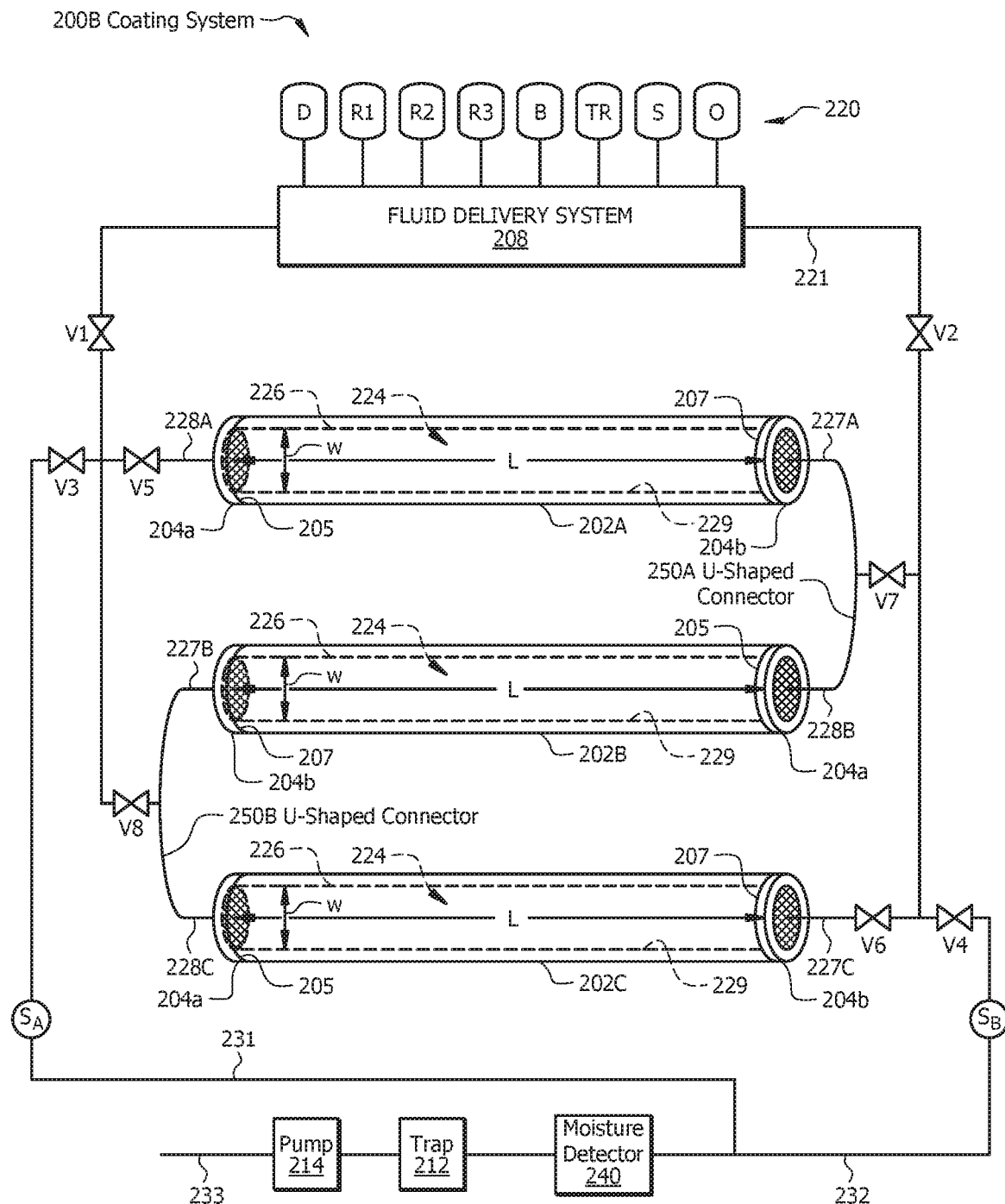
FIG. 7 is an exemplary schematic of a coating system configured for operation, and depicted sealingly engaged, with a plurality of housings according to some aspects.

FIG. 7 is an exemplary schematic of a coating system 200B configured for operation, and depicted sealingly engaged, with a plurality of housings, apparatus, or tools 202. In the embodiment of FIG. 7, three housings, apparatus, or tools 202, including a first housing, apparatus, or tool 202A, a second housing, apparatus, or tool 202B, and a third housing, apparatus, or tool 202C, are depicted. For simplicity, the controller 206 is not depicted. Coating system 200B can include a plasma generator 210, an ion generator 222, a heater 218a, and/or a pre-heater 218b, as depicted in FIG. 1A and FIG. 1B and described hereinabove. A number of arrangements of reactant gas sources and housings, apparatus, or tools 202 can be envisioned. Valving and fluid delivery system 208 can be controlled via controller (206, FIG. 1A, FIG. 1B) to control flow of fluids throughout the coating system 200B. For example, during a coating process, inert gas can be continuously introduced into first flow line 228A and first housing 202A by opening valves V1, V4, V5, and V6, and closing valves V2, V3, V7, and V8 such that inert gas is introduced into first housing 202A via first closure 204a thereof. The inert gas can flow through first housing 202A and out second closure 204b of first housing 202A to second flow line 227A, which serves as first flow line 228B of second housing 202B, via which inert gas flows into second housing 202B by way of first closure 204a of second housing 202B. The continuous flow of inert gas passes through second housing 202B and exits via second closure 204b thereof and second flow line 227B, which serves as first flow line 228C of third housing 202C, via which inert gas flows into third housing 202C by way of first closure 204a of third housing 202C. After passing through third housing 202C, inert gas can flow through second closure 204b thereof, valves V6 and V4 and flow line 232, optionally into trap 212 and pump 214. A pulse of a desired reactant can be introduced by opening the appropriate reactant gas source valve within fluid delivery system 208, whereby the pulse of reactant gas is introduced into the continuous flow of inert gas and introduced into first housing 202A. If desired, additional pulses of that desired reactant can be introduced into a housing 202 downstream of the first housing 202A. For example, one or more pulses of reactant introduced into second housing 202B or third housing 202C, for example by manipulating valves for introduction into a connector between two of the housings 202 (e.g., by opening valve V2 and valve V7 and introduction into a U-shaped connector 250A fluidically connecting second end 207 of first housing 202A and first end 205 of second housing 202B, or by opening valve V8 and introduction into a second U-shaped connector 250B fluidically connecting second end 207 of second housing 202B and first end 205 of third housing 202C). Once the desired reactant has reacted with the interior surface 229 of the plurality of housings, another reactant can be introduced co-currently or counter currently into the housings, for example co-currently by maintaining the valving utilized during injection of the first reactant gas or countercurrently by closing valves V1, V4, V7, V8 and opening valve V2, V3, V5, and V6 such that inert gas is introduced continuously into third housing 202C via second closure 204b thereof and second flow line 227C of third housing 202C. For countercurrent operation, the inert gas can flow through third housing 202C and out first closure 204a of third housing 202C to first flow line 228C, which is second flow line 227B of second housing 202B, via which inert gas flows into second housing 202B by way of second closure 204b of second housing 202B. The continuous flow of inert gas passes through second housing 202B and exits via first closure 204a thereof and first flow line 228B, which is second flow line 227A of first housing 202A, via which inert gas flows into first housing 202A by way of second closure 204b of first housing 202A. The inert gas passes out of first housing 202A via first closure 204a thereof and, via open valve V3, can pass into trap 212, and/or pump 214 via flow line 231. A pulse of a desired subsequent reactant can be introduced by opening an appropriate reactant gas source valve of fluid delivery system 208, whereby the pulse of the desired subsequent reactant gas is introduced into the continuous flow of inert gas and introduced into third housing 202C. If desired, additional pulses of the desired subsequent reactant can be introduced into a housing now downstream of the first housing 202C. For example, one or more pulses of the subsequent reactant can be introduced into second housing 202B or first housing 202A by manipulating valves for introduction into a connector (e.g., by opening valve V1 and valve V8 and introduction into U-shaped connector 250B fluidically connecting second end 207 of second housing 202B and first end 205 of third housing 202C, or by opening valve V7 and introduction into U-shaped connector 250A fluidically connecting second end 207 of first housing 202A and first end 205 of second housing 202B). Although a certain number of reactant gas sources 220 and housings 202 are depicted in the Figures, it is to be understood that a coating system of this disclosure can include any number of reactant gas sources 220 for operation with any number of housings 202 connected in series and/or in parallel. One of skill in the art will appreciate that the reactant gas sources 220, and the housings 202 can be plumbed together via a multitude of valving arrangements, headers, connectors, or the like to provide the concurrent and/or counter current flow of reactant gas pulses during the coating process. All such arrangements are within the scope of this disclosure.

In aspects, each of the plurality of housings 202 comprises a cylinder, such as a wellbore tubular. Each of the cylinders can have a length in a range of from about from about 1 to about 10 feet, from about 2 to about 9 feet, of from about 3 to about 8 feet, and/or an inside diameter (e.g., width W of FIG. 1A and FIG. 1B) of from about ¼ inch to about 10 inches, from about ¼ inch to about 12 inches, or from about 1 inch to about 15 inches.

Figure 8:
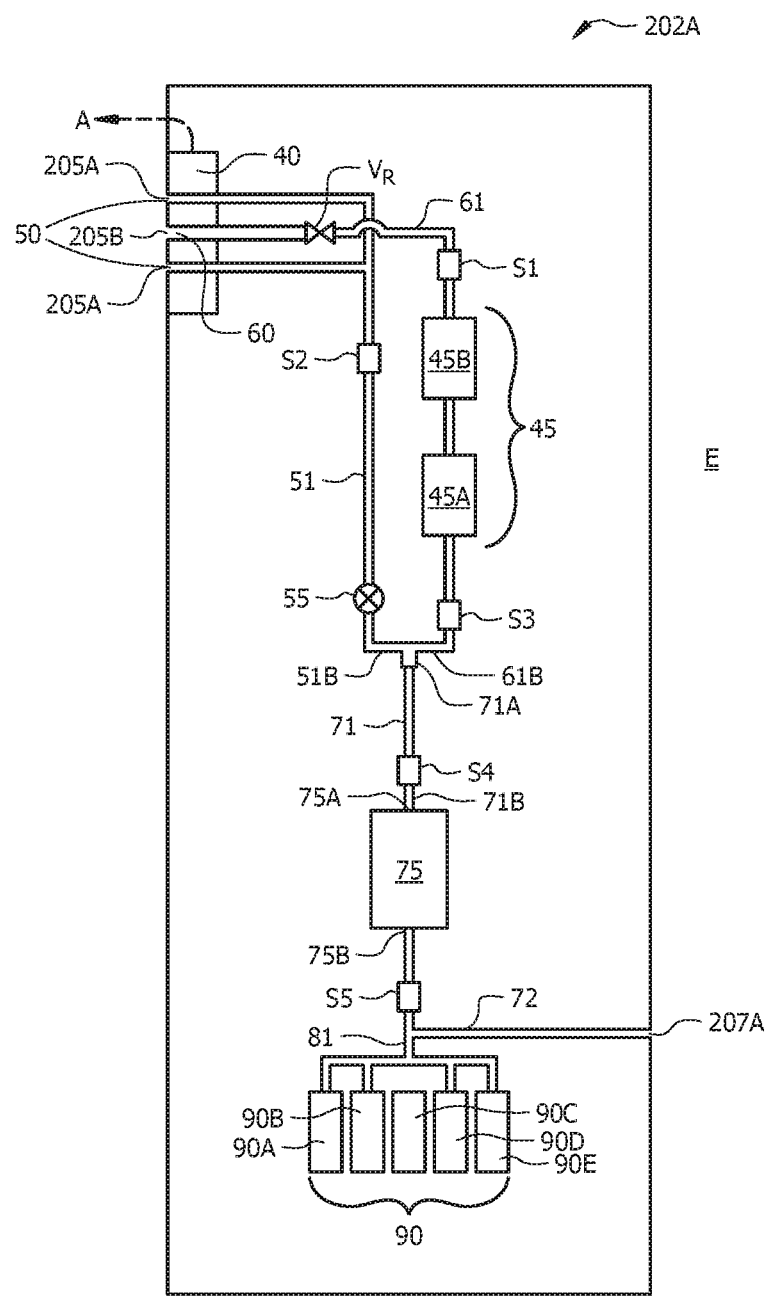
FIG. 8 is a schematic diagram of an example of a well tool that can be coated via the well tool coating system according to some aspects.

In embodiments, a well tool 202A having an interior surface 229 coated via the well tool coating system 200A of this disclosure is a sampling tool, such as a focused sampling tool, such as described, for example, in U.S. patent application Ser. No. 16/670,886 entitled, "Focused Formation Sampling Method and Apparatus", filed Oct. 31, 2019, the disclosure of which is hereby incorporated herein in its entirety for purposes not contrary to this disclosure. FIG. 8 is a schematic diagram of an exemplary focused sampling well tool 202A that can be coated via the well tool coating system 200A according to some aspects. Well tool 202A of FIG. 8 is a focused sampling well tool operable to take one or more fluid samples having a composition representative of a virgin formation fluid in formation 104 (FIG. 2) in one or more sample chambers 90 (with five sample chambers, including first sample chamber 90A, second sample chamber 90B, third sample chamber 90C, fourth sample chamber 90D, and fifth sample chamber 90E depicted in the embodiment of FIG. 8) from within the formation 104 (FIG. 2). A well tool 202A can comprise a sample line 61; a guard line 51; a common line 71; a pump 75; a discard line 72; a sampling line 81; the one or more sample chambers 90; one or more fluid ID sensors S positioned on the guard line, the sample line, the common line, or a combination thereof (with first fluid ID sensor S1 and third fluid ID sensor S3 depicted on sample line 61, second fluid ID sensor S2 depicted on guard line 51, fourth fluid ID sensor S4 depicted on common line 71, and fifth fluid ID sensor S5 depicted on pump outlet line 76); and a flow restrictor 55.

Sample line 61 has a sample line inlet 205B and a sample line outlet 61B. Guard line 51 has a guard line inlet 205A and a guard line outlet 51B. As depicted in the embodiment of FIG. 8, a focused sampling well tool 202A of this disclosure can comprise one or a plurality of lines that extend from guard line inlets 205A thereof and merge to form a single guard line 51 toward guard line outlet 51B. This configuration of guard line is intended to be included in the term "guard line(s) 51". In embodiments, the guard line(s) 51 is configured for a higher fluid flow rate $Q_G$ than a fluid flow rate $Q_S$ of the sample line 61. Common line 71 has a common line inlet 71A and a common line outlet 71B, and is fluidly connected with the sample line outlet 61B and the guard line outlet 51B, for example at a tee or Y junction. Pump 75 has a suction side inlet 75A and a discharge side outlet 75B. Suction side inlet 75A of pump 75 is fluidly connected with common line outlet 71B and discharge side outlet 75B of pump 75 is fluidly connected with discard line 72 and sampling line 81, for example via a tee or Y junction. Discard line 72 has a discard line outlet 207A. In embodiments, focused sampling tool 202A of this disclosure comprises a single pump 75, whereby fluid is pulled into the well tool 202A via a common pump (e.g., single pump 75) and a common suction line (e.g., common line 71). Sampling line 81 is fluidly connected with the one or more sample chambers 90.

Flow restrictor 55 is operable to prevent flow of fluid from guard line 51 to common line 71 in a first (e.g., closed) configuration and allow flow of fluid from the guard line 51 to the common line 71 in a second (e.g., open) configuration. In embodiments, flow restrictor 55 is a shutoff valve. In embodiments, sample line 61 has a flow restrictor thereupon, such as restrictor valve $V_R$, that is operable as a shutoff valve that can be actuated to prevent fluid flow through sample line 61. In some such embodiments, a separate restrictor 55 may not be present. Flow restrictor 55 can be a check valve. Restrictor 55 can be positioned on guard line 51 upstream of guard line outlet 51B. Sample line 61 can comprise a check valve upstream of sample line outlet 61B, in embodiments.

A focused sampling well tool 202A of this disclosure can further comprise a probe 40 that can extend from well tool 202A during formation sampling (as indicated by arrow A in FIG. 8) and define a sample zone 60 fluidly connected with the sample line inlet 205B of the sample line 61, a guard zone 50 fluidly connected with the guard line inlet 205A of the guard line 51, or both a sample zone 60 fluidly connected with the sample line inlet 205B of the sample line 61 and a guard zone 50 fluidly connected with the guard line inlets 205A of the guard line 51. For example, focused sampling well tool 202A of the embodiment of FIG. 8 further comprises probe 40 defining sample zone 60 fluidly connected with the sample line inlet 205B of the sample line 61, and guard zone 50 fluidly connected with the guard line inlets 205A of the guard line 51. The guard zone 50 and the sample zone 60 are in fluid communication with the subsurface formation 104 (FIG. 2), during operation of the focused sampling well tool 202A.

The comparative flow rate $Q_G$ in the guard line(s) 51 from guard zone(s) 50 and flow rate $Q_S$ in the sample line 61 from sample zone 60 can be represented by a ratio of flow rates $Q_G/Q_S$. (The flow rate into the sample line 61 from the sample zone is represented by $Q_S$, and is also referred to herein as the flow rate in the sample zone, and the flow rate into the guard line(s) from the guard zone(s) 50 is represented by $Q_G$, and is also referred to herein as the flow rate in the guard zone(s).) The flow rate $Q_S$ in the sample line 61 from sample zone 60 may be selectively increased and/or the flow rate $Q_G$ in the guard line(s) 51 from guard zone(s) 50 may be decreased to allow more fluid to be drawn into the sample zone 60. Alternatively, the flow rate $Q_S$ in the sample line 61 from sample zone 60 may be selectively decreased and/or the flow rate $Q_G$ in the guard line(s) 51 from guard zone(s) 50 may be increased to allow less fluid to be drawn into the sample line 61 via sample zone 60. A focused sampling tool 202A can comprise a single pump 75, a restrictor valve 55 and/or diameter of sample line 61 and/or guard line(s) 51 can be selected to provide the desired ratio $Q_G/Q_S$ of fluid flow rate in the guard zone(s) 50 to the fluid flow rate in the sample zone 60. In alternative configurations, focused sampling tool 202A can comprise two or more pumps, for example a first pump coupled to sample line 61 and one or more additional pumps coupled to guard line(s) 51, whereby the two or more pumps can be operated independently to provide to provide the desired ratio $Q_G/Q_S$ of fluid flow rate in the guard zone(s) 50 to the fluid flow rate in the sample zone 60.

A focused sampling well tool 202A can further comprise one or more dead volumes 45 in fluid communication with the sample line 61. The one or more dead volumes 45 can be online or offline dead volumes, meaning fluid in sample line 61 flows through the one or more dead volumes ("online") or does not flow through the one or more dead volumes ("offline") during a pre-sampling time period. As depicted in FIG. 8, the one or more dead volumes 45 can include a first dead volume 45A and a second dead volume 45B in series along the sample line 61. The one or more dead volumes 45 provide a total dead volume $V_{TOT}$. In embodiments, the total dead volume $V_{TOT}$ is greater than or equal to a total sample volume of the one or more sample chambers 90.

Focused sampling well tool 202A can be operated to take one or more fluid samples (in the one or more sample chambers 90) from formation 104, wherein the one or more fluid samples have a composition approximating that of a virgin formation fluid in formation 104.

Well tool coating system 200A can be utilized to coat an interior surface 229 extending from guard line inlet 205A and guard line 50 and/or from sample line inlet 205B and sample line 61 to discard line outlet 72. For example, well tool coating system 200A can be utilized to coat an interior surface 229 extending from guard line inlet 205A and guard line 50 and/or from sample line inlet 205B and sample line 61; optionally through the one or more dead volumes 45 (e.g., first dead volume 45A and second dead volume 45B); through common line 71, pump 75, optionally sampling line 81, and discard line 72; to discard line outlet 207A. Closures can be positioned on guard line inlets 205A and sample line inlet 205B and on discard line outlet 207A, and surface coating (e.g., ALD and/or CVD) performed on all or a portion of the resulting enclosed volume 226 therebetween.

During the forming of the coating, probe 40 can be extended from a retracted initial position or retracted from an extended initial position (e.g., respectively along or away from the direction indicated by arrow A) to ensure that an entire interior surface 229 that will be exposed to formation fluid during formation sampling can be coated. For example, the probe 40 may have telescoping portions of sample line inlet 205B and guard line inlets 205A that may be extended and coated to ensure complete coating of the entire flow path that will be in contact with the formation fluid during sampling. According to this disclosure, pulses of reactant gas can be introduced co-currently or counter currently from one or more pressurized cells via the guard line inlets 205A, the sample line inlet 205B, and the discard line outlet 207. That is the guard line inlets 205A and/or the sample line inlet 205B can be utilized to introduce one or more pulses of reactant(s), which can pass through well tool 202A, with unreacted reactant(s) and inert carrier gas exiting via discard line outlet 207A; and the guard line inlets 205A and/or the sample line inlet 205B or the discard line outlet 207A can be utilized for concurrent or counter current introduction of one or more pulses of the same or other reactant(s), which can pass through well tool 202A, with unreacted reactant(s) and inert carrier gas exiting via discard line outlet 207 or guard line inlets 205A and/or the sample line inlet 205B.

Figure 9:
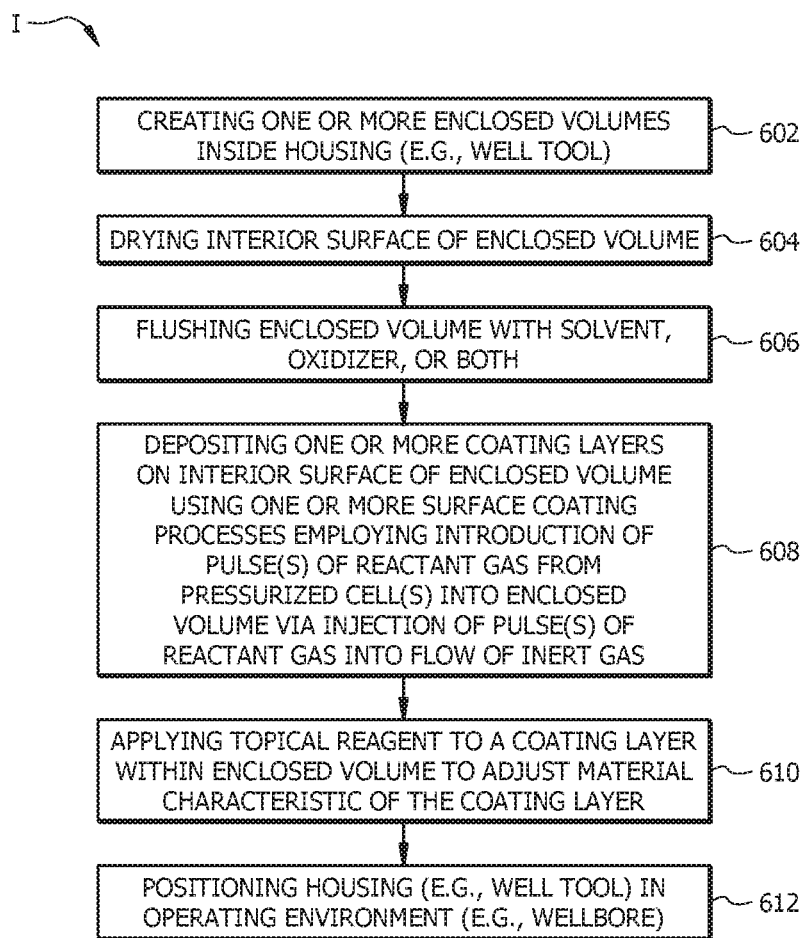
FIG. 9 is a flow chart of an example of a process for depositing coatings within housings, apparatus, or tools (e.g., well tools) according to some aspects.

In some examples, one or more coatings can be applied within a tool 202/well tool 202A in accordance with the process I shown in FIG. 9. Other examples can include more steps, fewer steps, different steps, or a different order of the steps than is shown in FIG. 9. The steps of FIG. 9 are discussed below with reference to the components discussed above in relation to FIGS. 1-8.

As indicated at block 602, the method I can comprise creating one or more enclosed volumes 226 inside the housing, apparatus, or tool 202/well tool 202A. This may involve closing off one or more passages (e.g., first passage 502a, second passage 502b of FIG. 6) through the tool 202/well tool 202A by attaching closures (e.g., first closure 204a, and second closure 204b of FIGS. 1A, FIG. 1B, and FIG. 3, first closure 504a, second closure 504b, third closure 504c, fourth closure 504d of FIG. 6) to first end or location 205 and second end or location 207 of the housing, apparatus, or tool 202/well tool 202A to form one or more enclosed volumes 226/226a/226b continuously spanning a length (e.g., the entire length) of an interior volume 224 of the tool 202/well tool 202A. Alternatively, this may involve closing off one or more passages through just a subpart of the tool 202/well tool 202A by attaching the closures (e.g., first closure 204a, and second closure 204b of FIG. 1A, FIG. 1B, and FIG. 3, first closure 504a, second closure 504b, third closure 504c, fourth closure 504d of FIG. 6) to the ends of the subpart, thereby creating one or more enclosed volumes 226 continuously spanning only the length of an interior volume 224 of the subpart. That is, the closures need not be attached to the axial or radial ends or edges of the tool 202/well tool 202A (e.g., the threaded terminal ends of the tool 202/well tool 202A that may couple with additional components such as a conveyance (e.g., drillpipe coupled to well tool 202A) or additional components of a downhole tool (e.g., additional components of a bottom hole assembly comprising a focused sampling well tool 202A) to form the one or more enclosed volumes 226/226a/226b, but rather extend from one end of the passage to another end of the passage, which passage need not continuously span the entire length or width of the tool 202/well tool 202A, but can extend from a first location 205 anywhere along a length of the tool 202/well tool 202A to another location 207 at a second (different) location anywhere along a length of the tool 202/well tool 202A. After forming the enclosed volume(s) 226, heat and/or pressure can be applied to the enclosed volume(s) 226 to create ambient conditions inside the enclosed volume(s) 226 that are conducive to one or more surface coating processes, such as ALD or CVD. For example, the pump 214 can pressurize the enclosed volume(s) 226 to create suitable ambient conditions inside the enclosed volume(s) 226 to perform one or more surface coating processes as described herein. Alternatively, the pump 214 can be used to evacuate all or portion of the enclosed volume 226, for example to aid in the introduction of one or more coating process reactant gases to the enclosed volume 224. For example, heating unit 218 can be used to control the temperature (e.g., heat) of the enclosed volume 226 to create suitable ambient conditions inside the enclosed volume(s) 226 to perform one or more surface coating processes as described herein.

As indicated at 604, the coating method can comprise drying the interior surface 229, as detailed hereinabove, prior to introducing any reactants thereto. For example, drying can be effected via heating under vacuum, for example by introducing a drying gas from drying gas source D into housing, apparatus, or tool 202, wherein the drying gas is heated by a preheater 218b and/or the housing, apparatus, or tool 202 is heated by a heater 218a, and hot drying gas is removed via second flow line 228. Moisture detector 240 can be utilized to monitor the drying process, and determine when sufficient drying of the interior surface 229 has been effected.

The method can comprise, as indicated at block 606, flushing the enclosed volume 226 with a solvent S, an oxidizer O, or both. For example, the controller 206 can operate the fluid delivery system 208 to provide sequential or simultaneous flow of the solvent S, the oxidizer O, or both into the enclosed volume 226. This may help to prepare the enclosed volume 226 for one or more surface coating processes.

At block 608, the coating system 200/well tool coating system 200A deposits one or more coatings within the enclosed volume 226 using one or more types of surface coating processes employing introduction of pulses of reactant gas from pressurized cell(s) into the enclosed volume via injection of the pulses of reactant gas into a flow of inert gas, as detailed hereinabove. For example, the controller 206 can operate the fluid delivery system 208 to provide sequential or simultaneous flow of reactant gases into the enclosed volume 226 in accordance with an ALD process, a CVD process, or both, as described hereinabove, to deposit the coatings. In other examples, the controller 206 can operate the fluid delivery system 208 to provide sequential or simultaneous flow of reactant gases into the enclosed volume 226 in accordance with one or more other types of surface coating processes to deposit the coatings. In embodiments, one or more of the reactant gases can be provided as a plasma produced in plasma generator 210.

The enclosed volume 226 can be configured to have certain ambient conditions that are more conducive to a surface coating process. For example, the enclosed volume 226 can be pressurized within a particular range configured to produce viscous flow (rather than molecular flow) of fluids therein, such as the reactant gases or buffer gases. Viscous flow is characterized by a Knudsen number, which is a dimensionless quantity of mean free path divided by a diameter of the flow channel (e.g., the enclosed volume 226). Knudsen numbers less than 0.01 characterize viscous flow, whereas Knudsen numbers higher than 0.01 characterize molecular flow. There is an inverse relationship between mean free path and pressure. Based on these factors, the enclosed volume 226 can be pressurized to achieve viscous flow. For instance, a flow channel with a diameter of 0.5 centimeters (cm) yields a Knudsen number of about 0.001 for nitrogen gas pressurized to 10 Torr Decreasing the pressure to 1 Torr yields a Knudsen number of 0.01. Any further decrease in the pressure below 1 Torr could further increase the mean free path and push the Knudsen number beyond the viscous flow regime and towards molecular flow. Thus, this flow channel can be pressurized between 1-10 Torr to achieve viscous flow. In aspects, one or more reactants utilized to deposit the coating layers at 606 are provided via a pressurized cell, as described hereinabove. In aspects, the interior surface 229 is coated at a coating temperature of room temperature, a coating pressure of atmospheric pressure, or both a coating temperature of room temperature and a coating pressure of atmospheric pressure.

In aspects, the enclosed volume 226 can be configured to produce laminar flow (as opposed to turbulent flow) of the fluids therein. Laminar flow can be achieved by configuring the enclosed volume 226 to have a Reynolds number that is less than 2300. The Reynolds number is defined as the flow rate of the fluid times the diameter of the enclosed volume 226, divided by the kinematic viscosity of the fluid and the cross-sectional area of the enclosed volume 226. Thus, in an example in which the diameter of the enclosed volume 226 is 0.56 cm and the kinematic viscosity for the fluid is $1.5 \times 10^{-5}$ (m$^2$/s), the upper bound on the flow rate can be set to 150-200 scm to ensure laminar flow.

Reactant-gas dosing and purge times (e.g., timing between pulses of reactant(s)) can be configured to optimize saturation (e.g., self-limiting growth) during a surface coating process, while not wasting excess reactant gas or deposition time. For example, reactant-gas dosing times may range from 0.1 s to 1.0 s, and purging times may range from about 5.0 s to about 10.0 s. This can result in relatively constant ALD growth per cycle, even when more reactant gas is added to the enclosed volume 226 or the purge time is extended.

As indicated at block 610, the process can comprise applying, via the coating system 200 (e.g., well tool coating system 200A), a topical reagent from topical reagent source TR to a coating layer within the enclosed volume 226 to adjust a material characteristic of the coating layer. The coating layer may be an uppermost coating layer in the enclosed volume 226. For example, the controller 206 can operate the fluid delivery system 208 to provide sequential or simultaneous flow of the topical reagent from topical reagent source TR into the enclosed volume 226 to adjust a material characteristic of coating layer 406. In some processes, applying a topical reagent at block 608 may be optional or not required where a material characteristic of an uppermost coating layer does not need adjustment. In some processes, applying a topical reagent at block 608 may be performed between on or more layers other than the uppermost coating layer. For example a topical reagent may be applied after an ALD coating layer is applied and before a CVD coating layer is applied; a topical reagent may be applied after a CVD coating layer is applied and before an ALD coating layer is applied, or combinations thereof Some or all of the above steps can be performed at a worksite or jobsite, such as, for example and without limitation, a wellsite 100. For example, the well tool coating system 200A can be positioned at the wellsite 100 for performing steps 602-610 after delivery of the well tool 202A to the wellsite 100 and prior to positioning the well tool 202A downhole. Some or all of the above steps can also be repeated, for example, in instances where there are multiple enclosed volumes inside the well tool 202A. Some or all of the above steps can also be repeated, for example, in instances where a well tool 202A is recovered from being deployed downhole, and while downhole an interior surface of the well tool 202A was exposed to formation fluid, wherein the process as depicted in FIG. 9 can be used to coat and/or re-coat all or a portion of the interior surface of the well tool 202A that was exposed to the formation fluid. In aspects, the first reactant gas source R1 and the second reactant gas source R2 are pressurized cells. In such aspects pump 214 may be absent.

In block 612, the tool 202/well tool 202A is positioned in an operating environment. For example, when housing, apparatus, or tool 202 comprises a well tool 202A, block 612 can comprise positioning the well tool 202A in the wellbore 102 (FIG. 2). For example, the well tool 202A can be positioned downhole using any suitable type of conveyance, such as a drillpipe, wireline, slickline, or coiled tubing. The tool 202/well tool 202A can then be utilized to perform one or more operations. For example, the well tool 202A can then be used to perform one or more downhole operations, such as, without limitation, formation fluid sampling.

In aspects, a method of coating a surface 229 of an interior region or volume 224 of a housing 202, wherein the interior volume 224 has a first end 205 and a second end 207, comprises: positioning the coating device or system 200 as described hereinabove and the housing, apparatus, or tool 202/well tool 202A proximate each other; sealingly engaging the first closure 204a to the first end 205 of the interior volume 224 of the housing, apparatus, or tool 202/well tool 202A and sealingly engaging the second closure 204b to the second end 207 of the interior volume 224 of the housing, apparatus, or tool 202/well tool 202A to provide enclosed interior volume 226; introducing one or more pulses of pressurized gas from the one or each of the plurality of pressurized cells into the enclosed volume 226 via pulsing of the pressurized gas from the one or the each of the plurality of pressurized cells 226 into an inert gas flow in the pressurized cell line; and depositing one or more coating layers on all or a portion of the interior surface 229 within the enclosed volume 226 by reaction of the one or more reactant gases.

In aspects, a method of coating an interior surface 229 of an interior volume or region 224 of a housing, apparatus, or tool 202, wherein the interior volume or region 224 has a first end 205 and a second end 207, comprises: enclosing all or a portion of the interior volume 224 of the housing, apparatus, or tool 202/well tool 202A to yield an enclosed volume 226; introducing one or more reactant gases to the enclosed volume 226 via an inlet line (e.g., first flow line 228 or second flow line 227); and forming one or more coating layers (e.g., base layer 404 and another coating layer 406 of FIG. 5) on all or a portion of an interior surface 229 of the housing, apparatus, or tool 202 via atomic layer deposition (ALD) or chemical vapor deposition (CVD) of the one or more reactant gases, wherein at least one of the one or more reactant gases is introduced into the enclosed volume 226 by introducing a pulse of pressurized gas comprising the at least one of the one or more reactant gases into a flow of inert gas in the inlet line or directly into the enclosed volume 226. The interior volume 224/enclosed interior volume 226 can comprise a fluid flow path of the tool, apparatus, or housing, apparatus, or tool 202/well tool 202A.

As detailed hereinabove, the depositing at 608 can comprise chemical vapor deposition (CVD), atomic layer deposition (ALD), or both. For example, in embodiments, the method can further comprise: forming an ALD layer by: (i) introducing a first reactant gas from a first reactant gas source R1 into the enclosed volume 226, such that at least a portion of the first reactant gas chemically bonds with the surface 229 to form a reactive layer; (ii) removing unreacted first reactant gas and/or gaseous byproducts from the enclosed volume 226; (iii) introducing a second reactant gas from a second reactant gas source R2 into the enclosed volume 226, such that at least some of the second reactant gas bonds with the reactive layer to form an ALD layer; and (iv) removing unreacted second reactant gas and/or gaseous byproducts from the enclosed volume 226. Some combination of (i) through (iv) may be utilized to form the ALD layer. For example, not all of (i) to (iv) need be utilized during the forming of the ALD layer.

For example and with reference now to FIG. 1A and FIG. 1B, forming an ALD layer can comprise (i) introducing a first reactant gas from first reactant gas source R1 into the enclosed volume 226, such that at least a portion of the first reactant gas chemically bonds with the interior surface 229 to form a reactive layer. Controller 206 can be utilized to control the formation of the reactant layer. Forming the ALD layer can further comprise (ii) removing unreacted first reactant gas and/or gaseous byproducts from the enclosed volume 226. Removing unreacted first reactant gas and/or gaseous byproducts from the enclosed volume 226 can comprise pumping via pump 214 unreacted first reactant gas and/or gaseous byproducts out of enclosed volume 226 via second flow line 227 or first flow line 228 and optionally trap 212 via continuous flow of buffer (e.g., from a buffer source B) into enclosed volume 226. Controller 206 can be utilized to control the removal of unreacted first reactant gas and/or gaseous byproducts from the enclosed volume 226, e.g., the timing of injection of one or more pulses of first reactant gas into a continuous flow of inert gas into the enclosed volume 226. Forming the ALD layer can further comprise (iii) introducing a second reactant gas from a second reactant gas source R2 into the enclosed volume 226, such that at least some of the second reactant gas bonds with the reactive layer to form an ALD layer. Controller 206 can be utilized to control the introducing of the second reactant gas from the second reactant gas source R2 into the enclosed volume 226. Forming the ALD layer can further comprise (iv) removing unreacted second reactant gas and/or gaseous byproducts from the enclosed volume 226. As noted above, steps (ii) and (iv) can be effected via pulsing of the first reactant gas and the second reactant gas from first reactant gas source R1 and second reactant gas source R2 (either or both of which can, in aspects be pressurized cells of the respective reactant gas) into a continuous flow of inert gas into the enclosed volume 226, such that each pulse of reactant gas enters enclosed volume 226 subsequent introduction thereto of continuously flowing inert gas. Steps (i) through (iv) of forming an ALD layer can be repeated to obtain a desired number of ALD coatings and a desired thickness of each coating within the ALD layer. During one or more of steps (i) through (iv) of forming the ALD layer, heating unit 218A and/or preheater 218B can be operated to provide a desired temperature within enclosed volume 226. Controller 206 can be utilized to control the temperature provided by heating unit 218A and/or preheater 218B. One or both of the first reactant gas or the second reactant gas can be provided from a source R1/R2 thereof via plasma generator 210. As noted hereinabove, utilizing plasma generator 210 to provide one or both of the first reactant gas and/or the second reactant gas can enable surface coating to occur under a wider range of ambient conditions (e.g., temperatures and pressures) inside the enclosed volume 226 as compared to a thermal approach using a heat source such as heating unit 218A, and/or enable a wider range of material properties to be realized as compared to a thermal approach using a heat source such as heating unit 218A.

In embodiments, the forming of the ALD layer or layers produced as detailed hereinabove is performed prior to and/or subsequent to deposition of a CVD layer. That is, with reference now to FIG. 5, an ALD layer formed by repetition of a combination of one or more steps (i) through (iv) can be the base layer 404 and/or can be another layer 406 deposited subsequent deposition of a disparate base layer (e.g., a layer in direct contact with interior surface 229) or subsequent deposition of an underlying layer or "underlayer" (e.g., a layer deposited prior to the ALD layer, but not in direct contact with interior surface 229). In embodiments, ALD can be utilized to deposit an ALD coating in applications in which no CVD coating is applied. Controller 206 can be utilized to precisely control the pulsing and timing (e.g., sequence and/or residence time of each gas in enclosed volume 226) of gases in each of the one or more steps (i) through (iv).

As noted hereinabove, the one or the plurality of first reactant gas sources R1 can comprise one or a plurality of first pressurized cells, wherein the one or each of the plurality of first pressurized cells comprises a first pressurized gas comprising the one or more first reactant gases, wherein the first pressurized gas is at a pressure of greater than the pressure within the housing, apparatus, or tool 202/well tool 202A (e.g., within the interior/enclosed volume pressure), wherein the one or each of the plurality of first pressurized cells is fluidically coupled to one of the one or more first flow lines 228 or second flow lines 227, and the one or the plurality of second reactant gas sources can comprise one or a plurality of second pressurized cells, wherein the one or each of the plurality of second pressurized cells comprises a second pressurized gas comprising the one or more second reactant gases, wherein the second pressurized gas is at a pressure of greater than the pressure within the housing, apparatus, or tool 202/well tool 202A (e.g., greater than the pressure within the interior/enclosed volume), wherein the one or each of the plurality of second pressurized cells is fluidically coupled to one of the one or more first flow lines 228 or second flow lines 227. In such aspects, the controller 206 is in electronic communication with the one or the plurality of first pressurized cells and the one or the plurality of second pressurized cells, and is configured to control concurrent and/or countercurrent injection of one or more pulses of the first pressurized gas into a flow of inert gas in the first pressurized cell line and one or more pulses of the second pressurized gas into a flow of inert gas in the second pressurized cell line, such that the one or more pulses of the first pressurized gas and the one or more pulses of the second pressurized gas are separately introduced into the enclosed volume with inert gas being introduced into the enclosed volume 226 prior to and subsequent introduction thereto of each of the one or more pulses of the first pressurized gas and the one or more pulses of the second pressurized gas.

In embodiments the method can comprise or further comprise forming a CVD layer by: (a) introducing at least a third reactant gas from a third reactant gas source R3 into the enclosed volume 226, such that the at least the third reactant gas chemically reacts with the surface 229. In embodiments, the method comprises both forming an ALD layer and a CVD layer, wherein forming both an ALD layer and a CVD layer comprises forming an ALD layer (e.g., an ALD base layer or underlayer) on the surface 229 and subsequently forming the CVD layer on the ALD layer or forming the CVD layer (e.g., a CVD base layer or underlayer) on the surface 229 and subsequently forming the ALD layer on the CVD layer.

For example and with reference now to FIG. 1A and FIG. 1B, forming a CVD layer can comprise: (a) introducing at least one reactant gas into the enclosed volume 226 such that it chemically reacts with a surface (e.g., interior surface 229) inside the enclosed volume 226. In some examples, forming the CVD layer can comprise introducing two or more reactant gases simultaneously and optionally continuously into the enclosed volume 226 such that the two or more reactant gases chemically react with a surface (e.g., interior surface 229, optionally previously coated with an ALD layer and/or etched via ALE) inside the enclosed volume 226. Controller 206 can be utilized to control the formation of the CVD layer. In embodiments, forming a CVD layer comprises introducing third reactant gas from a third gas source R3 and optionally a fourth reactant gas from a fourth gas source R4 into the enclosed volume 226 via a first flow line 228 or a second flow line 227. Controller 206 can be utilized to control the timing and duration of introduction of the third and/or fourth (or fifth, and so on) reactant gas into the enclosed volume 226 during formation of the CVD layer. Forming the CVD layer can further comprise (b) removing unreacted third reactant gas and/or fourth reactant gas or so on reactant gases and/or gaseous byproducts from the enclosed volume 226. Steps (a) and (b) of forming a CVD layer can be repeated to obtain a desired number of CVD coatings and a desired thickness of each coating within the CVD layer. Some combination of (a) and/or (b) may be utilized to form the CVD layer. The third reactant gas source R3 and/or the fourth reactant gas source R4, etc., can be pressurized cells as described hereinabove. Step (b) can be effected by introducing of the third and/or fourth (or fifth, and so on) reactant gas into the enclosed volume 226 by injection thereof as one or more pulses into a continuous flow of inert gas in the flow line into which the reactant gas is injected, in aspects.

During one or more of steps (a) or (b) of forming the CVD layer, heating unit 218A or preheater 218B can be operated to provide a desired temperature within enclosed volume 226. Controller 206 can be utilized to control the temperature provided by heating unit 218A and/or preheater 218B. One or both of the third reactant gas or the fourth reactant gas (and optionally additional reactant gas(es)) can be provided from a source R3/R4 thereof via plasma generator 210. As noted hereinabove, utilizing plasma generator 210 to provide one or both of the third reactant gas and/or the fourth reactant gas (and optionally additional reactant gas(es)) can enable surface coating to occur under a wider range of ambient conditions (e.g., temperatures and pressures) inside the enclosed volume 226 as compared to a thermal approach using a heat source such as heating unit 218A and/or preheater 218B, and/or enable a wider range of material properties to be realized as compared to a thermal approach using a heat source such as heating unit 218A and/or preheater 218B.

In embodiments, the CVD layer or layers produced as detailed hereinabove is performed prior to and/or subsequent to deposition of an ALD layer. That is, with reference now to FIG. 5, a CVD layer formed by repetition of a combination of one or more steps (a) and/or (b) can be the base layer 404 and/or can be another layer 406 deposited subsequent deposition of a disparate base layer (e.g., a layer in direct contact with interior surface 229) or an underlying layer or underlayer (e.g., a layer deposited prior to deposition of this CVD layer, but not in direct contact with interior surface 229). In embodiments, CVD can be utilized to deposit a CVD coating in applications in which no ALD coating is applied. In such cases, gas sources R3/R4 can include third reactant gas and/or fourth reactant gas, or so on, but first reactant gas sources R1 and/or second reactant gas sources R2 may be absent. (That is, the recitation of a third reactant gas from a third reactant gas source R3 should not be interpreted to require the use of a first reactant gas from a first reactant gas source R1 and a second reactant gas from a second reactant gas source R2.) Controller 206 can be utilized to precisely control the pulsing and timing (e.g., the sequence and residence time of each gas in enclosed volume 226) of gases in each of the one or more steps (a) and/or (b). In aspects employing no first or second gas sources R1/R2, a third reactant gas source R3 and/or a fourth reactant gas source R4 employed for CVD is a pressurized cell as described hereinabove.

The method can comprise monitoring a thickness of the one or more coating layers being deposited during the depositing 608, by measuring a concentration of unreacted reactant gas (e.g., a concentration of unreacted one or more first reactant gases and/or a concentration of unreacted one or more second reactant gases) passing out of the enclosed volume 226; measuring, via a quartz crystal microbalance, a mass being deposited during the depositing 608; or measuring, via an optical monitor, the thickness of the one or more coating layers being deposited at 608; and controlling a duration of the introducing of the reactant (s) (e.g., the introducing of the one or more first reactant gases and/or the introducing of the one or more second reactant gases) into the enclosed volume 226, an order of introducing of the reactant gases (e.g., the one or more first reactant gases and/or the one or more second reactant gases) into the enclosed volume 226, a concentration of the reactant gases (e.g., the one or more first reactant gases and/or of the one or more second reactant gases) being introduced into the enclosed volume 226, or a combination thereof to optimize the depositing of the one or more coating layers at 608. The monitoring of the thickness of the one or more coating layers can be effected via a sensor $S_A/S_B$.

As noted above, the method of coating the surface 229 of the interior region or volume 224 of the housing, apparatus, or tool 202/well tool 202A can further comprise performing an atomic layer etching (ALE) process to pre-treat the enclosed volume 226 prior to the forming of the one or more coating layers on the all or the portion of the surface 229 of the interior volume 224 of the housing, apparatus, or tool 202/well tool 202A and/or to reduce a thickness of at least one of the one or more coating layers. ALE can comprise (1) applying an etching gas from an etching gas source EG to a surface in the enclosed volume 226, such that the surface chemically reacts with and adsorbs the etching gas; (2) purging the etching gas and any gaseous byproducts from the enclosed volume 226; (3) applying low-energy ions to the portions of the surface that chemically reacted with the etching gas to etch away said portions; and (4) optionally purging byproducts from the enclosed volume 226. Applying the etching gas to the surface in the enclosed volume 226, can comprise applying the etching gas to an uncoated surface 229 to enhance subsequent deposition of a base layer comprising ALD or CVD or to a surface 229 upon which an ALD coating or a CVD coating was last applied (e.g., to an already coated surface 229). Applying the etching gas to the surface can comprise actuating the fluid delivery system 208 to supply the etching gas from etching gas source EG to within the enclosed volume 226 via injecting the etching gas into a continuous flow of inert gas in a first flow line 228 or second flow line 227. Subsequent the applying of the etching gas, performing the ALE can comprise (2) purging the etching gas and any gaseous byproducts from the enclosed volume 226, for example by actuating the pump 214 and/or actuating the fluid delivery system 208 to continue flow of the inert gas (e.g., buffer gas from buffer source B) to within the enclosed volume 226. Performing the ALE further comprises (3) applying low-energy ions to the portions of the surface that chemically reacted with the etching gas in steps (1) and/or (2) to etch away said portions. The low-energy ions can be provided via ion generator 222. Performing the ALE can further comprise optionally purging the enclosed volume 226, for example, via continuous flow of inert gas through housing or tool 202. The controller 206 be utilized to control the ALE. For example, the controller 206 can implement (2) and/or (4) by actuating the pump 214, actuating the fluid delivery system 208 to continually supply a buffer gas (e.g., buffer gas from buffer gas source B, which can be the same or different in (2) and (4)) to within the enclosed volume 226, or both. The controller 206 can implement (3) by actuating an ion generator 222, which can supply the low-energy ions to the enclosed volume 226. Some or all of these steps can be repeated as many times as is required. Some combination of (1) through (4) may be utilized to perform the ALE. For example, not all of (1) to (4) need be utilized during the ALE (e.g., purging byproducts at (4) may be absent).

For example and with reference now to FIG. 1A and FIG. 1B, the method of coating the surface 229 of the interior region or volume 224 of the housing, apparatus, or tool 202/well tool 202A can comprise: performing an atomic layer etching (ALE) process to pre-treat the enclosed volume 226 prior to the forming of the one or more coating layers on the all or the portion of the surface 229 of the interior volume 224 of the housing, apparatus, or tool 202/well tool 202A and/or to reduce a thickness of at least one of the one or more coating layers. That is, ALE etching can be performed on surface 229 prior to deposition of base layer 404 thereupon, e.g., prior to deposition of a ALD or CVD base layer on uncoated interior surface 229. Alternatively or additionally, performing ALE etching can be effected subsequent to deposition of a CVD layer (e.g., subsequent to deposition of a CVD base layer 404 or an underlying CVD layer 406), subsequent to deposition of an ALD layer (e.g., subsequent to deposition of an ALD base layer 404 or an underlying ALD layer 406), or both subsequent to deposition of a CVD layer and subsequent to deposition of an ALD layer (with the ALD layer being deposited before or after the CVD layer).

As described hereinabove, a method of coating a surface 229 of an interior region or volume 224 of a housing, apparatus, or tool 202/well tool 202A according to this disclosure can further comprise flowing a topical reagent to at least one of the one or more coating layers, wherein the topical reagent is configured to react with the coating layer and thereby adjust a material characteristic of the coating layer. The flowing of the topical reagent TR to at least one of the one or more coating layers can comprise flowing the topical reagent to a topmost coating layer, wherein the topmost coating layer is a one of the one or more coating layers farthest from the uncoated interior surface 229 of the enclosed interior volume 226 of the housing, apparatus, or tool 202/well tool 202A. For example and with reference now to FIG. 1A and FIG. 1B, the flowing the topical reagent to at least one of the one or more coating layers can comprise flowing the over a deposited ALD layer, flowing the topical reagent over a deposited CVD layer, flowing the topical reagent into the enclosed volume 226 during formation of an ALD layer (e.g., during one or more of the one or more steps (i) through (iv) of forming an ALD layer, as described hereinabove), flowing the topical reagent into the enclosed volume 226 during formation of a CVD layer (e.g., during one or more of the one or both steps (a) or (b) of forming a CVD layer, as described hereinabove), or a combination thereof. The topical reagent can be introduced into the enclosed volume via injection from topical reagent source TG into a continuous flow of inert gas in a first flow line 228 or a second flow line 227.

As noted hereinabove, the housing, apparatus, or tool 202 can comprise a furnace tube, an aircraft component (e.g., a wing, a fuselage), a component of a water supply/treatment system; a component of a vehicle fuel system; a well tool 202A; or another housing, apparatus, or tool.

The method can further comprise placing a component within the interior volume 224 (e.g., within enclosed interior volume 226 which serves as a deposition chamber for the component placed therein) of the housing, apparatus, or tool 202/well tool 202A and concurrently coating a surface of the component and interior surface 229 of the housing, apparatus, or tool 202/well tool 202A.

Forming the one or more coating layers on all or a portion of the surface 229 of the enclosed interior volume 226 of the housing, apparatus, or tool 202/well tool 202A via reaction of the reactant gases, optionally in the presence of the plasma, can further comprise actuating the housing, apparatus, or tool 202/well tool 202A to expose an additional surface (e.g., one or more surfaces of a telescoping component of the tool 202/well tool 202A) in the enclosed interior volume 226 of the housing, apparatus, or tool 202/well tool 202A and coating at least a portion of the additional surface, as described hereinabove.

The forming of the one or more coating layers can be effected at a worksite (e.g., wellsite 100) at which the housing, apparatus, or tool 202/well tool 202A will subsequently be employed (e.g., well tool 202A placed downhole for use), has previously been employed (e.g., well tool 202A recovered from downhole use), or both. For example, one or more coating layers can be formed on a well tool 202A at a wellsite 100 at which the well tool 202A has been and/or will be employed.

The housing, apparatus, or tool 202 can comprise a well tool 202A. The well tool 202A can comprise a logging while drilling (LWD) tool, a measurements while drilling (MWD) tool, or a sampling while drilling (SWD) tool. In such embodiments, the interior volume 224 of the well tool 202A can comprise a fluid flow path configured for flow of a formation fluid from an exterior E of the well tool 202A through an interior (e.g., interior volume 224) of the well tool 202A. In some embodiments, the interior volume 224 of the well tool 202A can comprise a fluid flow path configured for flow of a formation fluid from an exterior E of the well tool 202A through an inlet(s) (205A/B) and an interior (e.g., interior volume 224) of the well tool 202A and back out of the well tool 202A via discard line outlet 207A. In some embodiments, the interior volume 224 of the well tool 202A can comprise a fluid flow path configured for flow of a formation fluid from an exterior E of the well tool 202A through an inlet (e.g., sample line inlet 205B) and interior (e.g., interior volume 224) of the well tool 202A and into a sample chamber 90.

The method can further comprise, subsequent the coating, placing the housing, apparatus, or tool 202/well tool 202A in an operating environment therefor (e.g., a wellbore 102) and contacting the coated surface 229 with an operations fluid (e.g., contacting the coated surface 229 with formation fluid from the formation 104). For example and with reference now to FIG. 7, due to the portability of the herein disclosed coating system 200/well tool coating system 200A, a coating can be formed on all or a portion of the interior surface 229 of the enclosed volume 226 of the well tool 202A, and the well tool 202A subsequently introduced into a wellbore 102 for utilization thereof (e.g., for taking one or more formation fluid samples). Prior to coating the tool 202A, analysis of the formation fluid and/or an anticipated composition thereof can be utilized to determine what coating to deposit on one or more surfaces of an interior volume 224 of the well tool 202A. Subsequent utilization downhole in wellbore 102 (for example subsequent the taking of formation samples in sample chambers 90 as described hereinabove with reference to the well tool 202A of FIG. 7), formation sample analysis can again be utilized to determine whether or not the well tool 202A should be subjected to further coatings with well tool coating system 200A. For example, in applications where anticipated formation composition is utilized to determine an initial coating of the enclosed volume(s) 226 of well tool 202A, following utilization of well tool 202A downhole to obtain the one or more formation fluid samples in the one or more sample chambers 90, analysis of the formation samples retrieved from downhole by the well tool 202A can be utilized to determine if alternative and/or additional coating layers should be deposited within well tool 202A. For example, should anticipated formation composition not include significant mercury (Hg) and/or hydrogen sulfide ($H_2S$), and no initial coating be performed within well tool 202A, while analysis of sample(s) retrieved from the formation 104 indicates the presence of substantial $H_2S$ and/or Hg (or another component which can interfere with formation fluid analysis and/or corrode well tool 202A), a coating process of the type disclosed herein can be performed on-site to reduce the interaction of the interior surface 229 with the formation fluid during subsequent testing with well tool 202A. Alternatively, if an initial coating selected for the well tool 202A were to prove ineffective to prevent and/or reduce interaction of the analyzed formation fluid obtained with well tool 202A, a new or additional coating of well tool 202A can be performed based on the analysis of the obtained formation fluid in sample chamber(s) 90 prior to further sampling therewith. If desired, etching to remove all or a portion of prior deposited coating(s) can be effected via ALE, as detailed hereinabove, prior to deposition of the new or additional coating layer(s).

Those of ordinary skill in the art will readily appreciate various benefits that may be realized by the present disclosure. The herein disclosed coating system 200/well tool coating system 200A enable on-site coating of interior surfaces 229 of a housing, apparatus, or tool 202/well tool 202A at a jobsite, for example, at a wellsite 100 where a downhole tool 202A will be and/or has previously been utilized. This allows for the deposition of coatings within tools upon determination of a composition of a fluid to which the interior of the housing, apparatus, or tool 202/well tool 202A will subsequently be employed. The coatings can thus be tailored to meet the needs of a particular application at hand and thereby avoid costly delays associated with transporting a housing, apparatus, or tool 202/well tool 202A to a traditional coating facility at a fixed location that may be hundreds of miles from the worksite.

Utilizing pressurized cell(s) to provide pulses of reactant gas can allow for more uniform coating of the interior surface 229, and/or coating at substantially atmospheric pressure within housing, apparatus, or tool 202, in aspects. Utilization of the pressurized cell(s) can enable the use of a reactant having a lower vapor pressure than the current pressure of the tool being coated. For example, even if the vapor pressure of one of the reactants, (e.g., trimethylaluminum) has a vapor pressure (e.g., 0.01 atm) substantially below that of the housing, apparatus, or tool 202/well tool 202A (e.g., atmospheric pressure) it can be introduced via the pressurized cell without the use of a mechanical pump to pull a vacuum on the tool body and decrease the pressure thereof below the vapor pressure of the reactant.

In accordance with the present disclosure, it may be desirable to deposit a coating on a surface (e.g., within a well tool) to withstand a particular environment to which the surface will be exposed during operation, and thereby prolong a life of a housing, apparatus or tool comprising the surface. In contrast to traditional deposition systems that require a well tool to be disassembled into subcomponents of small enough size to fit inside an expensive commercial vacuum-chamber, which serves as a deposition chamber, housings, apparatus, and tools (e.g., well tools) need not be disassembled prior to coating with the methods, systems, and devices disclosed herein. Furthermore, in contrast to transporting a housing, apparatus, or tool to a commercial vacuum-chambers located at manufacturing facilities or laboratory facilities (which restricts when and how many times a surface coating process can be applied to the well tool), in accordance with the present disclosure housing, apparatus, and tools (e.g., well tools) can be coated proximate a jobsite (e.g., wellsite) and need not be transported, thereby saving the cost and time associated with transportation and promotes the application of multiple coatings (e.g., between jobs) as needed.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure. For instance, any example(s) described herein can be combined with any other example(s) to yield further examples.

Additional Disclosure

The following are non-limiting, specific embodiments in accordance with the present disclosure:

In a first embodiment, a coating system for coating, with one or more surface coating processes, an interior surface of a housing defining an interior volume comprises: a first closure and a second closure to sealingly engage with (e.g., a first end or inlet and a second end or inlet of) the housing; one or more first flow lines fluidically coupled to the first closure and one or more second flow lines fluidically coupled to the second closure (e.g., to form an enclosed volume); a pressurized cell comprising pressurized gas, wherein the pressurized gas comprises at least one reactant, wherein the pressurized gas is at a pressure of greater than a pressure within the interior volume within the housing (e.g., within the enclosed volume), wherein the pressurized cell is fluidically coupled to a pressurized cell line comprising one of the one or more first flow lines or one of the one or more second flow lines; and a controller in electronic communication with the pressurized cell, wherein the controller is configured to control injection of a pulse of the pressurized gas into a flow of inert gas in the pressurized cell line, whereby the pulse of the pressurized gas is introduced into the interior volume of the housing (e.g., into the enclosed volume), coating the interior surface of the housing with a coating layer.

A second embodiment can include the coating system of the first embodiment, comprising a plurality of pressurized cells.

A third embodiment can include the coating system of the second embodiment, comprising a first pressurized cell and a second pressurized cell, wherein the first pressurized cell comprises a first pressurized gas comprising a first reactant, wherein the first pressurized gas is at the pressure of greater than the pressure within the interior volume of the housing (e.g., within the enclosed volume), wherein the first pressurized cell is fluidically coupled to a first pressurized cell line comprising one of the one or more first flow lines or one of the one or more second flow lines, and wherein the second pressurized cell comprises a second pressurized gas comprising a second reactant, wherein the second pressurized gas is at a pressure of greater than the pressure within the interior volume of the housing (e.g., within the enclosed volume), wherein the second pressurized cell is fluidically coupled to a second pressurized cell line comprising one of the one or more first flow lines or one of the one or more second flow lines.

A fourth embodiment can include the coating system of the third embodiment, wherein the controller is in electronic communication with the first pressurized cell and the second pressurized cell, and wherein the controller is configured to control injection of one or more pulses of the first pressurized gas into a flow of inert gas in the first pressurized cell line and one or more pulses of the second pressurized gas into a flow of inert gas in the second pressurized cell line, such that the one or more pulses of the first pressurized gas and the one or more pulses of the second pressurized gas are separately introduced into the interior volume within the housing (e.g., into the enclosed volume) with inert gas being introduced into the interior volume within the housing (e.g., into the enclosed volume) prior to and subsequent introduction thereto of each of the one or more pulses of the first pressurized gas and the one or more pulses of the second pressurized gas.

A fifth embodiment can include the coating system of the third embodiment or fourth embodiment, wherein both the first pressurized cell line and the second pressurized cell line comprise one or a same one of the one or more first flow lines or the one or more second flow lines; wherein the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines.

A sixth embodiment can include the coating system of any one of the third to fifth embodiments, wherein the first reactant comprises trimethyl-aluminum, wherein the second reactant comprises ozone or water, and wherein the coating layer comprises aluminum oxide.

A seventh embodiment can include the coating system of any one of the third to sixth embodiments, wherein the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines, such that one or more pulses of the first pressurized gas can be introduced into the interior volume within the housing (e.g., into the enclosed volume) counter currently to introduction into the interior volume within the housing (e.g., into the enclosed volume) of one or more pulses of the second pressurized gas.

An eighth embodiment can include the coating system of any one of the first to seventh embodiments, wherein the pressurized gas consists of the at least one reactant, or wherein the pressurized gas comprises from about 10 to about 90 volume percent (vol %), from about 20 to about 80*vol %, or from about 30 to about 70 vol % of an inert buffer gas.

A ninth embodiment can include the coating system of any one of the first to eighth embodiments, further comprising: a plasma source fluidically coupled to the housing to provide plasma for the one or more surface coating processes; an ion source fluidically coupled to the housing to provide ions for the one or more surface coating processes; a heating unit in thermal communication with the housing to heat the housing for the one or more surface coating processes; or any combination thereof, wherein the controller is further in electronic communication with the plasma source, the ion source, the heating unit, or the combination thereof to control the plasma source, the ion source, the heating unit, or the combination thereof during the one or more surface coating processes.

A tenth embodiment can include the coating system of any one of the first to ninth embodiments further comprising: a heater; and a drying gas source, wherein the heater is in thermal communication with the drying gas source, the housing, and/or a line fluidically coupling the drying gas source and the housing such that a hot drying gas can be provided within the interior volume within the housing (e.g., the enclosed volume) to dry the interior surface of the housing prior to introduction of the at least one reactant thereto.

An eleventh embodiment can include the coating system of the tenth embodiment, wherein the controller is in further electronic communication with the heater and/or the drying gas source to control the heater, and/or the drying gas source during the one or more surface coating processes.

A twelfth embodiment can include the coating system of the tenth embodiment or eleventh embodiment, further comprising one or more pumps upstream or downstream of the housing; wherein the one or more pumps include a vacuum pump on at least one of the one or more first flow lines, a vacuum pump on at least one of the one or more second flow lines, or both a vacuum pump on at least one of the one or more first flow lines and a vacuum pump on at least one of the one or more second flow lines, wherein the vacuum pump is configured to create a vacuum in the interior volume within the housing (e.g., within the enclosed volume) during drying, whereby the one or more first flow lines or the one or more second flow lines having the vacuum pump can operate as a vacuum line.

A thirteenth embodiment can include the coating system of the twelfth embodiment further comprising a moisture detector on the vacuum line, wherein the moisture detector is operable to measure a moisture content of the hot drying gas removed from the interior volume within the housing (e.g., the enclosed volume) during drying.

A fourteenth embodiment can include the coating system of any one of the first to thirteenth embodiments, wherein the coating system is operable for coating the interior surface at a coating temperature of room temperature, a coating pressure of atmospheric pressure, or both a coating temperature of room temperature and a coating pressure of atmospheric pressure.

A fifteenth embodiment can include the coating system of any one of the first to fourteenth embodiments, wherein the one or more surface coating processes comprise chemical vapor deposition (CVD), atomic layer deposition (ALD), or both.

A sixteenth embodiment can include the coating system of any one of the first to fifteenth embodiments further comprising a sensor for monitoring a thickness of the coating layer, wherein the sensor comprises a sensor for measuring a concentration of unreacted reactants passing out of the interior volume within the housing (e.g., the enclosed volume), a quartz crystal microbalance, or an optical monitor, wherein the controller is further in electronic communication with the sensor and operable to adjust a duration of the pulse or a plurality of the pulses, an order of introduction of a plurality of the pulses from the pressurized cell or a plurality of the pressurized cells, a concentration of reactant gas in the pressurized cell or a plurality of the pressurized cells, or a combination thereof.

A seventeenth embodiment can include the coating system of any one of the first to sixteenth embodiments, wherein the interior volume has an aspect ratio that is less than or equal to about 0.5, wherein the aspect ratio is an average width of the interior volume divided by an average length thereof.

An eighteenth embodiment can include the coating system of any one of the first to seventeenth embodiments, wherein the housing comprises a furnace tube, an aircraft component, a component of a water supply/treatment system or a component of a vehicle fuel system, or a well tool.

A nineteenth embodiment can include the coating system of the eighteenth embodiment, wherein the housing comprises the well tool, and wherein the well tool is a logging while drilling (LWD) tool, a measurements while drilling (MWD) tool, or a sampling while drilling (SWD) tool, and wherein a volume of the well tool defines a fluid flow path for flow of a formation fluid from an exterior of the well tool through an interior of the well tool.

A twentieth embodiment can include the coating system of any one of the first to nineteenth embodiments, wherein the coating system is portable and further comprises a hauler to transport the coating system to a worksite proximate the housing.

A twenty first embodiment can include the coating system of any one of the first to twentieth embodiments, comprising a plurality of housings connected in series and/or in parallel: wherein each of the plurality of housings comprises a first closure and a second closure to sealingly engage (e.g., with a first end and a second end, respectively, of) the housing (e.g., to provide an enclosed volume), and one or more first flow lines fluidically coupled to the first closure and one or more second flow lines fluidically coupled to the second closure; and wherein the one or more second flow lines of each of the plurality of housings are fluidically coupled as the one or more first flow lines of any immediately downstream housing.

A twenty second embodiment can include the coating system of the twenty first embodiment, wherein the plurality of housings are connected in series, and, wherein each of the plurality of housings except the last housing of the series of housings is fluidically connected with an immediately downstream housing via a U-shaped connector.

A twenty third embodiment can include the coating system of the twenty second embodiment, wherein one or more of the U shaped connectors are fluidically coupled with a pressurized cell, whereby a pulse of a reactant gas comprising one or more reactants can be injected from the pressurized cell into the U-shaped connector and thus introduced into the interior volume (e.g., into the enclosed volume) of a housing immediately downstream of the U-shaped connector.

A twenty fourth embodiment can include the coating system of any one of the twenty first to twenty third embodiments, wherein each of the plurality of housings comprises a cylinder, and wherein the plurality comprises from about 2 to about 30, from about 2 to about 15, or from about 5 to about 10 housings.

A twenty fifth embodiment can include the coating system of the twenty fourth embodiment, wherein each of the cylinders has a length of from about from about 1 to about 10 feet, from about 2 to about 5 feet, of from about 2 to about 10 feet, and an inside diameter of from about ¼ inch to about 10 inches, from about ¼ inch to about 12 inches, or from about 1 inch to about 15 inches.

In a twenty sixth embodiment, a method of coating, with one or more surface coating processes, an interior surface of a housing defining an interior volume, comprises: positioning a coating system and a housing proximate each other, wherein the coating system comprises: a first closure and a second closure to sealingly engage a housing; one or more first flow lines fluidically coupled to the first closure and one or more second flow lines fluidically coupled to the second closure; one or a plurality of pressurized cells, wherein the one or each of the plurality of pressurized cells comprises pressurized gas comprising one or more reactant gases, wherein the pressurized gas is at a pressure of greater than a pressure within the interior volume of the housing, wherein the one or each of the plurality of pressurized cells is fluidically coupled to a pressurized cell line comprising one of the one or more first flow lines or one of the one or more second flow lines; and a controller in electronic communication with the one or the plurality of pressurized cells, wherein, for the one or each of the plurality of pressurized cells, the controller is configured to control injection of a pulse of the pressurized gas into a flow of inert gas in the pressurized cell line, whereby the pulse of the pressurized gas is introduced into the interior volume, coating the interior surface of the housing with a coating layer; sealingly engaging the first closure to an inlet of the housing and sealingly engaging the second closure to an outlet of the housing (e.g., to form an enclosed volume); introducing one or more pulses of the pressurized gas from the one or each of the plurality of pressurized cells into the interior volume (e.g., into the enclosed volume) via pulsing of the pressurized gas from the one or the each of the plurality of pressurized cells into an inert gas flow in the pressurized cell line; and depositing one or more coating layers on all or a portion of the interior surface within the interior volume (e.g., within the enclosed volume) by reaction of the one or more reactant gases.

A twenty seventh embodiment can include the method of the twenty sixth embodiment, further comprising forming the one or each of the plurality of pressurized cells by reducing a pressure of a cell to less than a vapor pressure of the one or more reactant gases, introducing the one or more reactant gases into the cell, and increasing the pressure of the cell to the pressure of greater than the pressure within the interior volume of the housing via introduction of additional gas into the cell, wherein the additional gas comprises at least one of the one or more reactant gases or an inert buffer gas.

A twenty eighth embodiment can include the method of the twenty sixth embodiment or the twenty seventh embodiment, wherein the coating system comprises a first pressurized cell and a second pressurized cell, wherein the first pressurized cell comprises a first pressurized gas comprising a first reactant, wherein the first pressurized gas is at a pressure of greater than the pressure within the interior volume of the housing, wherein the first pressurized cell is fluidically coupled to a first pressurized cell line comprising one of the one or more first flow lines or one of the one or more second flow lines, and wherein the second pressurized cell comprises a second pressurized gas comprising a second reactant, wherein the second pressurized gas is at the pressure of greater than the pressure within the interior volume of the housing, wherein the second pressurized cell is fluidically coupled to a second pressurized cell line comprising one of the one or more first flow lines or one of the one or more second flow lines, and wherein the controller is in electronic communication with the first pressurized cell and the second pressurized cell.

A twenty ninth embodiment can include the method of the twenty eighth embodiment further comprising controlling injection of one or more pulses of the first pressurized gas into a flow of inert gas in the first pressurized cell line and one or more pulses of the second pressurized gas into a flow of inert gas in the second pressurized cell line such that the one or more pulses of the first pressurized gas and the one or more pulses of the second pressurized gas are separately introduced into the interior volume within the housing (e.g., into the enclosed volume) with inert gas being introduced into the interior volume within the housing (e.g., into the enclosed volume) prior to and subsequent introduction thereto of each of the one or more pulses of the first pressurized gas and the one or more pulses of the second pressurized gas.

A thirtieth embodiment can include the method of the twenty ninth embodiment, wherein (i) both the first pressurized cell line and the second pressurized cell line comprise one or a same one of the one or more first flow lines or the one or more second flow lines, whereby the one or more pulses of the first reactant gas and the one or more pulses of the second reactant gas are introduced co-currently into a same end of the housing; or (ii) wherein the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines, whereby the one or more pulses of the first reactant gas and the one or more pulses of the second reactant gas are introduced counter currently into opposite ends of the housing.

A thirty first embodiment can include the method of any one of the twenty ninth to thirtieth embodiments further comprising alternating introduction of one or a plurality of pulses of the first pressurized gas into the interior volume within the housing (into the enclosed volume) with introduction of one or a plurality of pulses of the second pressurized gas into the interior volume.

A thirty second embodiment can include the method of any one of the twenty ninth to thirty first embodiments, wherein (ii) the first pressurized cell line comprises one or the one or more first flow lines and wherein the second pressurized cell line comprises one of the one or more second flow lines; or wherein the first pressurized cell line comprises one or the one or more second flow lines and wherein the second pressurized cell line comprises one of the one or more first flow lines, and wherein the one or more pulses of the first pressurized gas are introduced into the interior volume within the housing (e.g., into the enclosed volume) counter currently to introduction into the interior volume within the housing (e.g., into the enclosed volume) of the one or more pulses of the second pressurized gas.

A thirty third embodiment can include the method of any one of the twenty ninth to thirty second embodiments, wherein (ii) the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines, whereby the one or more pulses of the first reactant gas and the one or more pulses of the second reactant gas are introduced into opposite ends of the housing, wherein the first reactant and the second reactant are the same reactant, whereby one or more pulses of the same reactant are alternately introduced into the interior volume within the housing (e.g., into the enclosed volume) counter currently (e.g., via a first end or inlet and a second end or inlet of the housing).

A thirty fourth embodiment can include the method of any one of the twenty eighth to thirty third embodiments, wherein the first reactant comprises trimethyl-aluminum, wherein the second reactant comprises ozone or water, and wherein the one or more coating layers comprise aluminum oxide.

A thirty fifth embodiment can include the method of the thirty fourth embodiment, wherein the reaction comprises a chemical vapor deposition (CVD) reaction, an atomic layer deposition (ALD) reaction, or both, such that the one or more coating layers respectively comprise an ALD layer, a CVD layer, or both.

A thirty sixth embodiment can include the method of any one of the twenty sixth to thirty fifth embodiments further comprising drying the interior surface of the housing prior to introducing any of the pressurized gas into the housing.

A thirty seventh embodiment can include the method of the thirty sixth embodiment, wherein drying comprising heating under vacuum.

A thirty eighth embodiment can include the method of the thirty sixth embodiment or thirty seventh embodiment, wherein drying comprises providing a hot drying gas in the interior volume within the housing (e.g., in the enclosed volume), and monitoring the drying by measuring a moisture content of the hot drying gas passing out of the housing during the drying.

A thirty ninth embodiment can include the method of the thirty eighth embodiment further comprising drying to a moisture content of less than or equal to about 0.01, 0.005, or 0.001 volume percent (vol %) moisture.

A fortieth embodiment can include the method of any one of the twenty sixth to thirty ninth embodiments further comprising: monitoring a thickness of the one or more coating layers being deposited during the depositing by: measuring a concentration of unreacted one or more reactant gases passing out of the interior volume within the housing (e.g., out of the enclosed volume); measuring, via a quartz crystal microbalance, a mass being deposited during the depositing; and/or measuring, via an optical monitor, the thickness of the one or more coating layers being deposited; and controlling a duration of the one or more pulses being introduced, an order of introduction of a plurality of the pulses being introduced from the one or the plurality of the pressurized cells, a concentration of the one or more reactant gases in the one or the plurality of the pressurized cells, or a combination thereof to optimize the depositing.

A forty first embodiment can include the method of any one of the twenty sixth to fortieth embodiments, wherein the one or more surface coating processes comprise one or more chemical vapor deposition (CVD), one or more atomic layer deposition (ALD), or both.

A forty second embodiment can include the method of the forty first embodiment further comprising: (i) forming an ALD layer by: introducing a pulse comprising a first reactant gas into the interior volume (e.g., the enclosed volume) via a first pressurized cell, such that at least a portion of the first reactant gas chemically bonds with the interior surface to form a reactive layer; removing unreacted first reactant gas and/or gaseous byproducts from the interior volume (e.g., the enclosed volume) via passage of the flow of inert gas introduced subsequent the pulse of the first reactant gas; and introducing a pulse comprising a second reactant gas into the interior volume (e.g., the enclosed volume), such that at least some of the second reactant gas bonds with the reactive layer to form the ALD layer; (ii) forming a CVD layer by: introducing a pulse comprising at least a third reactant gas into the interior volume (e.g., the enclosed volume) via a third pressurized cell such that the at least the third reactant gas chemically reacts with the interior surface to form the CVD layer; or (iii) both forming an ALD layer via (i) and a CVD layer via (ii), wherein forming both an ALD layer and a CVD layer comprises forming an ALD layer on the interior surface and subsequently forming the CVD layer on the ALD layer or forming the CVD layer on the interior surface and subsequently forming the ALD layer on the CVD layer.

A forty third embodiment can include the method of the forty second embodiment further comprising performing an atomic layer etching (ALE) process to pre-treat the interior surface prior to the depositing of the one or more coating layers and/or to reduce a thickness of at least one of the one or more coating layers.

A forty fourth embodiment can include the method of the forty third embodiment, wherein ALE comprises: introducing an etching gas to the interior volume within the housing (e.g., to the enclosed volume) such that the interior surface chemically reacts with and adsorbs the etching gas; purging the etching gas and any gaseous byproducts from the interior volume (e.g., the enclosed volume); and applying low-energy ions to the portions of the surface that chemically reacted with the etching gas to etch away said portions.

A forty fifth embodiment can include the method of any one of the forty second to forty fourth embodiments further comprising introducing a topical reagent to at least one of the one or more coating layers, wherein the topical reagent reacts with the at least one coating layer to adjust a material characteristic of the at least one coating layer.

A forty sixth embodiment can include the method of the forty fifth embodiment, wherein the introducing the topical reagent to at least one of the one or more coating layers comprises introducing the topical reagent to a topmost coating layer, the topmost coating layer being one of the one or more coating layers positioned farthest away from the interior surface.

A forty seventh embodiment can include the method of any one of the twenty sixth to forty sixth embodiments, wherein the housing comprises a furnace tube, an aircraft component, a component of a water supply/treatment system, or a component of a vehicle fuel system.

A forty eighth embodiment can include the method of any one of the twenty sixth to forty eighth embodiments, wherein the housing comprises a well tool, wherein the well tool is a logging while drilling (LWD) tool, a measurements while drilling (MWD) tool, or a sampling while drilling (SWD) tool, and wherein a volume of the well tool defines a fluid flow path for flow of a formation fluid from an exterior of the well tool through an interior of the well tool.

A forty ninth embodiment can include the method of the forty eighth embodiment, wherein forming the one or more coating layers on all or the portion of the interior surface further comprises actuating the well tool to expose an additional interior surface of the well tool and coating at least a portion of the additional interior surface.

A fiftieth embodiment can include the method of the forty ninth embodiment further comprising placing the well tool in a wellbore and contacting the formation fluid with the coated surface.

A fifty first embodiment can include the method of the fiftieth embodiment, wherein the well tool is a formation sampling tool, and further comprising taking a formation fluid sample with the well tool, retrieving the formation fluid sample from the wellbore, performing a composition analysis of the formation fluid sample, and determining whether or not to recoat all or a portion of the interior surface of the well tool based on the compositional analysis.

In a fifty second embodiment, a method of coating an interior surface of a housing defining a volume, comprises: enclosing all or a portion of the volume of the housing to yield an enclosed volume; introducing one or more reactant gases to the enclosed volume via an inlet line; and forming one or more coating layers on all or a portion of an interior surface of the housing via atomic layer deposition (ALD) or chemical vapor deposition (CVD) of the one or more reactant gases, wherein at least one of the one or more reactant gases is introduced into the enclosed volume by introducing a pulse of pressurized gas comprising the at least one of the one or more reactant gases into a flow of inert gas in the inlet line or directly into the enclosed volume.

A fifty third embodiment can include the method of the fifty second embodiment further comprising introducing the pulse of the at least one reactant gas via a pressurized cell, wherein the pressurized cell comprises pressurized gas comprising the at least one reactant gas, wherein the pressurized gas is at a pressure of greater than a pressure within the enclosed volume, and wherein the pressurized cell is fluidically coupled to the inlet line.

A fifty fourth embodiment can include the method of the fifty third embodiment further comprising introducing another pulse of pressurized gas into the enclosed volume via the inlet line or via another inlet line or directly into the housing on an opposite end of the housing, wherein the another pulse comprises the at least one reactant gas or another reactant gas.

A fifty fifth embodiment can include the method of the fifty fourth embodiment further comprising introducing the another pulse of the pressurized gas comprising the at least one reactant gas or the another reactant gas via the pressurized cell or another pressurized cell, wherein the another pressurized cell comprises pressurized gas comprising the at least one reactant gas or the another reactant gas, wherein the pressurized gas comprising the at least one reactant gas or the another reactant gas is at a pressure of greater than the pressure within the enclosed volume, and wherein the another pressurized cell is fluidically coupled to the inlet line, the another inlet line, or the housing.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, R1, and an upper limit, Ru, is disclosed, any number falling within the range is specifically disclosed. In particular, the following numbers within the range are specifically disclosed: $R=R1+k*(Ru-R1)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A method of coating, with one or more surface coating processes, an interior surface of a housing defining an interior volume, the method comprising:
    positioning a coating system and a housing proximate each other,
    wherein the coating system comprises: a first closure and a second closure to sealingly engage the housing; one or more first flow lines fluidically coupled to the first closure and one or more second flow lines fluidically coupled to the second closure; one or a plurality of pressurized cells, wherein the one or each of the plurality of pressurized cells comprises pressurized gas comprising one or more reactant gases, wherein the pressurized gas is at a pressure of greater than a pressure within the interior volume of the housing, wherein the one or each of the plurality of pressurized cells is fluidically coupled to a pressurized cell line comprising one of the one or more first flow lines or one of the one or more second flow lines; and a controller in electronic communication with the one or the plurality of pressurized cells, wherein, for the one or each of the plurality of pressurized cells, the controller is configured to control injection of a pulse of the pressurized gas into a flow of inert gas in the pressurized cell line, whereby the pulse of the pressurized gas is introduced into the interior volume, coating the interior surface of the housing with a coating layer;
    sealingly engaging the first closure to an inlet of the housing and sealingly engaging the second closure to an outlet of the housing;
    introducing one or more pulses of the pressurized gas from the one or each of the plurality of pressurized cells via pulsing of the pressurized gas from the one or the each of the plurality of pressurized cells into an inert gas flow in the pressurized cell line; and
    depositing one or more coating layers on all or a portion of the interior surface within the interior volume of the housing by reaction of the one or more reactant gases, wherein the reaction comprises a chemical vapor deposition (CVD) reaction, an atomic layer deposition (ALD) reaction, or both, such that the one or more coating layers respectively comprise an ALD layer, a CVD layer, or both.

2. The method of claim 1 further comprising forming the one or each of the plurality of pressurized cells by reducing a pressure of a cell to less than a vapor pressure of the one or more reactant gases, introducing the one or more reactant gases into the cell, and increasing the pressure of the cell to the pressure of greater than the pressure within the interior volume of the housing via introduction of additional gas into the cell, wherein the additional gas comprises at least one of the one or more reactant gases or an inert buffer gas.

3. The method of claim 1, wherein the coating system comprises a first pressurized cell and a second pressurized cell, wherein the first pressurized cell comprises a first pressurized gas comprising a first reactant, wherein the first pressurized gas is at a pressure of greater than the pressure within the interior volume of the housing, wherein the first pressurized cell is fluidically coupled to a first pressurized cell line comprising one of the one or more first flow lines or one of the one or more second flow lines, and wherein the second pressurized cell comprises a second pressurized gas comprising a second reactant, wherein the second pressurized gas is at a pressure of greater than the pressure within the interior volume of the housing, wherein the second pressurized cell is fluidically coupled to a second pressurized cell line comprising one of the one or more first flow lines or one of the one or more second flow lines, and wherein the controller is in electronic communication with the first pressurized cell and the second pressurized cell.

4. The method of claim 3 further comprising controlling injection of one or more pulses of the first pressurized gas into a flow of inert gas in the first pressurized cell line and one or more pulses of the second pressurized gas into a flow of inert gas in the second pressurized cell line such that the one or more pulses of the first pressurized gas and the one or more pulses of the second pressurized gas are separately introduced into the interior volume of the housing with inert gas being introduced into the interior volume of the housing prior to and subsequent introduction thereto of each of the one or more pulses of the first pressurized gas and the one or more pulses of the second pressurized gas.

5. The method of claim 4, wherein (i) both the first pressurized cell line and the second pressurized cell line comprise one or a same one of the one or more first flow lines or the one or more second flow lines, whereby the one or more pulses of the first reactant gas and the one or more pulses of the second reactant gas are introduced co-currently into a same end of the housing; or (ii) wherein the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines, whereby the one or more pulses of the first reactant gas and the one or more pulses of the second reactant gas are introduced counter currently into opposite ends of the housing.

6. The method of claim 4 further comprising alternating introduction of one or a plurality of pulses of the first pressurized gas into the interior volume with introduction of one or a plurality of pulses of the second pressurized gas into the interior volume.

7. The method of claim 4, wherein (ii) the first pressurized cell line comprises one or the one or more first flow lines and wherein the second pressurized cell line comprises one of the one or more second flow lines; or wherein the first pressurized cell line comprises one or the one or more second flow lines and wherein the second pressurized cell line comprises one of the one or more first flow lines, and wherein the one or more pulses of the first pressurized gas are introduced into the interior volume counter currently to introduction into the interior volume of the one or more pulses of the second pressurized gas.

8. The method of claim 1 further comprising:
monitoring a thickness of the one or more coating layers being deposited during the depositing by: measuring a concentration of unreacted one or more reactant gases passing out of the interior volume; measuring, via a quartz crystal microbalance, a mass being deposited during the depositing; and/or measuring, via an optical monitor, the thickness of the one or more coating layers being deposited; and
controlling a duration of the one or more pulses being introduced, an order of introduction of a plurality of the pulses being introduced from the one or the plurality of the pressurized cells, a concentration of the one or more reactant gases in the one or the plurality of the pressurized cells, or a combination thereof to optimize the depositing.

9. The method of claim 5, wherein (ii) the first pressurized cell line comprises one of the one or more first flow lines and wherein the second pressurized cell line comprises one of the one or more second flow lines; or wherein the first pressurized cell line comprises one of the one or more second flow lines and wherein the second pressurized cell line comprises one of the one or more first flow lines, whereby the one or more pulses of the first reactant gas and the one or more pulses of the second reactant gas are introduced into opposite ends of the housing, wherein the first reactant and the second reactant are the same reactant, whereby one or more pulses of the same reactant are alternately introduced into the interior volume within the housing (e.g., into the enclosed volume) counter currently (e.g., via a first end or inlet and a second end or inlet of the housing).

10. The method of claim 3, wherein the first reactant comprises trimethyl-aluminum, wherein the second reactant comprises ozone or water, and wherein the one or more coating layers comprise aluminum oxide.

11. The method of claim 1 further comprising: (i) forming an ALD layer by: introducing a pulse comprising a first reactant gas into the interior volume (e.g., the enclosed volume) via a first pressurized cell, such that at least a portion of the first reactant gas chemically bonds with the interior surface to form a reactive layer; removing unreacted first reactant gas and/or gaseous byproducts from the interior volume (e.g., the enclosed volume) via passage of the flow of inert gas introduced subsequent the pulse of the first reactant gas; and introducing a pulse comprising a second reactant gas into the interior volume (e.g., the enclosed volume), such that at least some of the second reactant gas bonds with the reactive layer to form the ALD layer; (ii) forming a CVD layer by: introducing a pulse comprising at least a third reactant gas into the interior volume (e.g., the enclosed volume) via a third pressurized cell such that the at least the third reactant gas chemically reacts with the interior surface to form the CVD layer; or (iii) both forming an ALD layer via (i) and a CVD layer via (ii), wherein forming both an ALD layer and a CVD layer comprises forming an ALD layer on the interior surface and subsequently forming the CVD layer on the ALD layer or forming the CVD layer on the interior surface and subsequently forming the ALD layer on the CVD layer.

12. The method of claim 1, wherein the housing comprises a furnace tube, an aircraft component, a component of a water supply/treatment system, or a component of a vehicle fuel system.

13. The method of claim 1, wherein the housing comprises a well tool, wherein the well tool is a logging while drilling (LWD) tool, a measurements while drilling (MWD) tool, or a sampling while drilling (SWD) tool, and wherein a volume of the well tool defines a fluid flow path for flow of a formation fluid from an exterior of the well tool through an interior of the well tool.

14. The method of claim 13, wherein forming the one or more coating layers on all or the portion of the interior surface further comprises actuating the well tool to expose an additional interior surface of the well tool and coating at least a portion of the additional interior surface.

15. The method of claim 14 further comprising placing the well tool in a wellbore and contacting the formation fluid with the coated surface.

16. The method of claim 15, wherein the well tool is a formation sampling tool, and further comprising taking a formation fluid sample with the well tool, retrieving the formation fluid sample from the wellbore, performing a composition analysis of the formation fluid sample, and determining whether or not to recoat all or a portion of the interior surface of the well tool based on the compositional analysis.

17. A method of coating an interior surface of a housing defining a volume, the method comprising:
enclosing all or a portion of the volume of the housing to yield an enclosed volume;
introducing one or more reactant gases to the enclosed volume via an inlet line; and
forming one or more coating layers on all or a portion of an interior surface of the housing via atomic layer deposition (ALD) or chemical vapor deposition (CVD) of the one or more reactant gases,
wherein at least one of the one or more reactant gases is introduced into the enclosed volume by introducing a pulse of pressurized gas comprising the at least one of the one or more reactant gases into a flow of inert gas in the inlet line or directly into the enclosed volume comprising introducing the pulse of the at least one reactant gas via a pressurized cell, wherein the pressurized cell comprises pressurized gas comprising the at least one reactant gas, wherein the pressurized gas is at a pressure of greater than a pressure within the enclosed volume, and wherein the pressurized cell is fluidically coupled to the inlet line.

18. The method of claim 17 further comprising introducing another pulse of pressurized gas into the enclosed volume via the inlet line or via another inlet line or directly into the housing on an opposite end of the housing, wherein the another pulse comprises the at least one reactant gas or another reactant gas.

19. The method of claim 18 further comprising introducing the another pulse of the pressurized gas comprising the at least one reactant gas or the another reactant gas via the pressurized cell or another pressurized cell, wherein the another pressurized cell comprises pressurized gas comprising the at least one reactant gas or the another reactant gas, wherein the pressurized gas comprising the at least one reactant gas or the another reactant gas is at a pressure of greater than the pressure within the enclosed volume, and wherein the another pressurized cell is fluidically coupled to the inlet line, the another inlet line, or the housing.

* * * * *